(12) United States Patent  
Kyle et al.

(10) Patent No.: US 8,995,148 B2  
(45) Date of Patent: Mar. 31, 2015

(54) BACKPLANE FOR ELECTRICALLY COUPLING MODULAR INFORMATION HANDLING RESOURCES TO ONE OR MORE OTHER INFORMATION HANDLING RESOURCES

(71) Applicant: Dell Products L.P., Round Rock, TX (US)

(72) Inventors: Lawrence A. Kyle, Salado, TX (US); Robert Johnson, Round Rock, TX (US); Shawn Hoss, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 189 days.

(21) Appl. No.: 13/670,583

(22) Filed: Nov. 7, 2012

(65) Prior Publication Data

US 2014/0126171 A1   May 8, 2014

(51) Int. Cl.
*H05K 7/14* (2006.01)
(52) U.S. Cl.
USPC .......................................................... 361/788

(58) Field of Classification Search
USPC .......................................................... 361/788
See application file for complete search history.

(56) References Cited

U.S. PATENT DOCUMENTS

2002/0181194 A1* 12/2002 Ho et al. ..................... 361/684
2004/0209493 A1* 10/2004 Garnett et al. ............. 439/76.1

* cited by examiner

*Primary Examiner* — Jenny L Wagner
*Assistant Examiner* — Michael P McFadden
(74) *Attorney, Agent, or Firm* — Jackson Walker L.L.P.

(57) ABSTRACT

In accordance with embodiments of the present disclosure, a backplane for electrically coupling modular information handling resources to one or more other information handling resources, may include a printed circuit board, a first plurality of slots, and a second plurality of slots. The printed circuit board may have a first surface and a second surface opposite the first surface. The first plurality of slots may be mounted to the first surface and the second plurality of slots may be mounted to the second surface, such that each of the second plurality of slots are offset from an adjacent slot of the first plurality of slots in a direction parallel to a plane defined by the first surface and each of the second plurality of slots are rotated approximately 180 degrees from an adjacent slot of the first plurality of slots.

18 Claims, 19 Drawing Sheets

BACKPLANE FOR ELECTRICALLY COUPLING MODULAR INFORMATION HANDLING RESOURCES TO ONE OR MORE OTHER INFORMATION HANDLING RESOURCES

TECHNICAL FIELD

The present disclosure relates to modular information handling systems. More specifically, embodiments of the disclosure provide systems and methods for a chassis drawer for providing access to modular information handling resources for addition and/or removal of such modular information handling resources.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Oftentimes, information handling systems and other information handling resources (e.g., storage devices, input/output devices, and other peripheral devices) are each manufactured in a modular form factor and may be configured to be disposed in a chassis configured to receive such modular components. Such a chassis and its component modular information handling systems and information handling resources typically include various rails, carriers, and other mechanical components allowing for a person to add and remove the modular information handling systems and information handling resources from the chassis. In traditional modular systems, information handling resources (including hard disk drives) and their corresponding chassis bays, are typically accessed from a side of the chassis in which the information handling resources may be added or removed. However, because access may be limited to the periphery of the chassis, such an architecture may limit the density of modular components that may be disposed in a chassis.

SUMMARY

In accordance with the teachings of the present disclosure, the disadvantages and problems associated with traditional approaches to accessing modular information handling resources in a chassis have been substantially reduced or eliminated.

In accordance with embodiments of the present disclosure, a drawer for receiving components may comprise an inner member, and intermediate member, and a carrier member. The inner member may include two substantially planar and generally parallel opposite inner member sides defining a drawer height and a substantially planar inner member bottom generally perpendicular to the inner member sides and defining a drawer width. The intermediate member may be mechanically coupled to the inner member such that the intermediate member is configured to slide relative to the inner member in a direction generally perpendicular to the drawer height and the drawer width. The carrier member may be mechanically coupled to the intermediate member such that the carrier member is configured to slide relative to the inner member and the intermediate member in a direction generally perpendicular to the drawer height and the drawer width. The carrier member may comprise a substantially planar carrier member top generally parallel to the inner member bottom, a substantially planar carrier member bottom generally parallel to the carrier member top, a carrier spine mechanically coupled between the carrier member top and the carrier member bottom, a plurality of bays, each bay having one or more structural components for receiving a modular information handling resource and configured such that the bay is accessed for insertion or removal of the modular information handling resource via a carrier member side of the carrier member generally parallel to the inner member side, and at least one web generally parallel to the inner member sides and mechanically coupling the carrier member to the intermediate member such that when the drawer is translated to an open position, each of the plurality of bays is accessible.

In accordance with these and other embodiments of the present disclosure, an information handling system may include a chassis and a drawer for receiving components, comprising. The drawer may comprise an inner member, and intermediate member, and a carrier member. The inner member may be fixedly coupled to the chassis and include two substantially planar and generally parallel opposite inner member sides defining a drawer height and a substantially planar inner member bottom generally perpendicular to the inner member sides and defining a drawer width. The intermediate member may be mechanically coupled to the inner member such that the intermediate member is configured to slide relative to the inner member in a direction generally perpendicular to the drawer height and the drawer width. The carrier member may be mechanically coupled to the intermediate member such that the carrier member is configured to slide relative to the inner member and the intermediate member in a direction generally perpendicular to the drawer height and the drawer width. The carrier member may include a substantially planar carrier member top generally parallel to the inner member bottom, a substantially planar carrier member bottom generally parallel to the carrier member top, a carrier spine mechanically coupled between the carrier member top and the carrier member bottom, and a plurality of bays, each bay having one or more structural components for receiving a modular information handling resource and configured such that the bay is accessed for insertion or removal of the modular information handling resource via a carrier member side of the carrier member generally parallel to the inner member side, and at least one web generally parallel to the inner member sides and mechanically coupling the carrier member to the intermediate member such that when the drawer is translated to an open position, each of the plurality of bays is accessible.

In accordance with embodiments of the present disclosure, a method may include mechanically coupling an intermediate member to an inner member, wherein the inner member comprises two substantially planar and generally parallel opposite inner member sides defining a drawer height and a substantially planar inner member bottom generally perpendicular to the inner member sides and defining a drawer width, and the intermediate member is mechanically coupled to the inner member such that the intermediate member is configured to slide relative to the inner member in a direction generally perpendicular to the drawer height and the drawer width. The method may also include mechanically coupling a carrier member to the intermediate member such that the carrier member is configured to slide relative to the inner member and the intermediate member in a direction generally perpendicular to the drawer height and the drawer width, wherein the carrier member comprises a substantially planar carrier member top generally parallel to the inner member bottom, a substantially planar carrier member bottom generally parallel to the carrier member top, a carrier spine mechanically coupled between the carrier member top and the carrier member bottom, a plurality of bays, each bay having one or more structural components for receiving a modular information handling resource and configured such that the bay is accessed for insertion or removal of the modular information handling resource via a carrier member side of the carrier member generally parallel to the inner member side, and at least one web generally parallel to the inner member sides and mechanically coupling the carrier member to the intermediate member such that when the drawer is translated to an open position, each of the plurality of bays is accessible.

In accordance with these and other embodiments of the present disclosure, a backplane for electrically coupling modular information handling resources to one or more other information handling resources, may include a printed circuit board, a first plurality of slots, and a second plurality of slots. The printed circuit board may have a first surface and a second surface opposite the first surface. The first plurality of slots may be mounted to the first surface and the second plurality of slots may be mounted to the second surface, such that each of the second plurality of slots are offset from an adjacent slot of the first plurality of slots in a direction parallel to a plane defined by the first surface and each of the second plurality of slots are rotated approximately 180 degrees from an adjacent slot of the first plurality of slots.

In accordance with these and other embodiments of the present disclosure, a backplane for electrically coupling modular information handling resources to one or more other information handling resources, may include a printed circuit board, a first plurality of openings, a first plurality of slots, a second plurality of openings, and a second plurality of slots. The printed circuit board may have a first surface and a second surface opposite the first surface. The first plurality of openings may be formed in the first surface and the first plurality of slots mounted to the printed circuit board within the first plurality of openings. The second plurality of openings may be formed in the second surface and the second plurality of slots may be mounted to the printed circuit board within the second plurality of openings.

In accordance with these and other embodiments of the present disclosure, a system may include a structural member, a release latch, and a slider. The structural member may define at least a portion of a bay for receiving an information handling resource. The release latch may be mechanically coupled to the structural member. The slider may be slidably coupled to the structural member and mechanically coupled to the structural member by an ejection spring with an ejection spring force configured to bias the slider in a first position relative to the structural member in absence of a force other than the rejection spring force. The slider may configured to, when the information handling resource is inserted into the bay, slide relative to the structural member in a direction opposite the ejection spring force and away from the first position and engage with the release latch, such that when engaged with the release latch, the slider is biased in a second position away from the first position.

In accordance with these and other embodiments of the present disclosure, an information handling system, may include a chassis and a drawer mechanically coupled to the chassis. The chassis may have a plurality of bays. Each bay configured to receive an information handling resource and each bay may include a structural member, a release latch, and a slider. The structural member may define at least a portion of the bay. The release latch may be mechanically coupled to the structural member. The slider may be slidably coupled to the structural member and mechanically coupled to the structural member by an ejection spring with an ejection spring force configured to bias the slider in a first position relative to the structural member in absence of a force other than the rejection spring force. The slider may be configured to, when the information handling resource is inserted into the bay slide relative to the structural member in a direction opposite the ejection spring force and away from the first position and engage with the release latch, such that when engaged with the release latch, the slider is biased in a second position away from the first position.

In accordance with these and other embodiments of the present disclosure, a method may include sliding a slider slidably coupled to the structural member and mechanically coupled to the structural member by an ejection spring with an ejection spring force configured to bias the slider in a first position relative to the structural member in absence of a force other than the rejection spring force, wherein the sliding is in a direction opposite the ejection spring force and away from the first position, and wherein the structural member defines at least a portion of a bay for receiving an information handling resource. The method may also include engaging the slider with a release latch mechanically coupled to the structural member, such that when engaged with the release latch, the slider is biased in a second position away from the first position.

In accordance with these and other embodiments of the present disclosure, a drawer for receiving components may include a caddy tray and at least one caddy. The caddy tray may include a substantially planar caddy tray bottom defining a caddy tray depth and a caddy tray width. The at least one caddy may be mechanically coupled to the caddy tray via a hinge mechanically coupled to the caddy tray bottom such that the caddy pivots relative to the caddy tray about the hinge, the hinge having an axis generally parallel to the caddy tray depth, the at least one caddy having a plurality of bays, each bay having one or more structural components for receiving a modular information handling resource and configured such that the bay is accessed for insertion or removal of the modular information handling resource when the at least one caddy is pivoted from a closed position to an open position.

In accordance with these and other embodiments of the present disclosure, an information handling system may include a chassis and a drawer for receiving components. The drawer may include a caddy tray comprising a substantially planar caddy tray bottom defining a caddy tray depth and a caddy tray width. The drawer may also include at least one caddy mechanically coupled to the caddy tray via a hinge mechanically coupled to the caddy tray bottom such that the caddy pivots relative to the caddy tray about the hinge, the hinge having an axis generally parallel to the caddy tray depth, the at least one caddy having a plurality of bays, each bay having one or more structural components for receiving a modular information handling resource and configured such that the bay is accessed for insertion or removal of the modular information handling resource when the at least one caddy is pivoted from a closed position to an open position. The drawer may additionally include a drawer cover fixedly coupled to the caddy tray. The drawer may further include a drawer sleeve fixedly coupled to the chassis and slidably coupled to the drawer cover, such that the drawer cover slides relative to the drawer sleeve and such that when the drawer is translated to an open position relative to the chassis and when the at least one caddy is pivoted from a closed position to an open position, each of the plurality of bays is accessible.

In accordance with these and other embodiments of the present disclosure, a method comprising may include mechanically coupling a caddy tray to at least one caddy, wherein the caddy tray comprises a substantially planar caddy tray bottom defining a caddy tray depth and a caddy tray width and the at least one caddy is mechanically coupled to the caddy tray via a hinge mechanically coupled to the caddy tray bottom such that the caddy pivots relative to the caddy tray about the hinge, the hinge having an axis generally parallel to the caddy tray depth, the at least one caddy having a plurality of bays, each bay having one or more structural components for receiving a modular information handling resource and configured such that the bay is accessed for insertion or removal of the modular information handling resource when the at least one caddy is pivoted from a closed position to an open position.

Technical advantages of the present disclosure may be apparent to those of ordinary skill in the art in view of the following specification, claims, and drawings.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1-23, wherein like numbers are used to indicate like and corresponding parts. For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more busses operable to transmit communication between the various hardware components.

In this disclosure, the term "information handling resource" may broadly refer to any component system, device or apparatus of an information handling system, including without limitation processors, busses, memories, input-output devices and/or interfaces, storage resources, network interfaces, motherboards, electro-mechanical devices (e.g., fans), displays, and power supplies.

Figure 1:
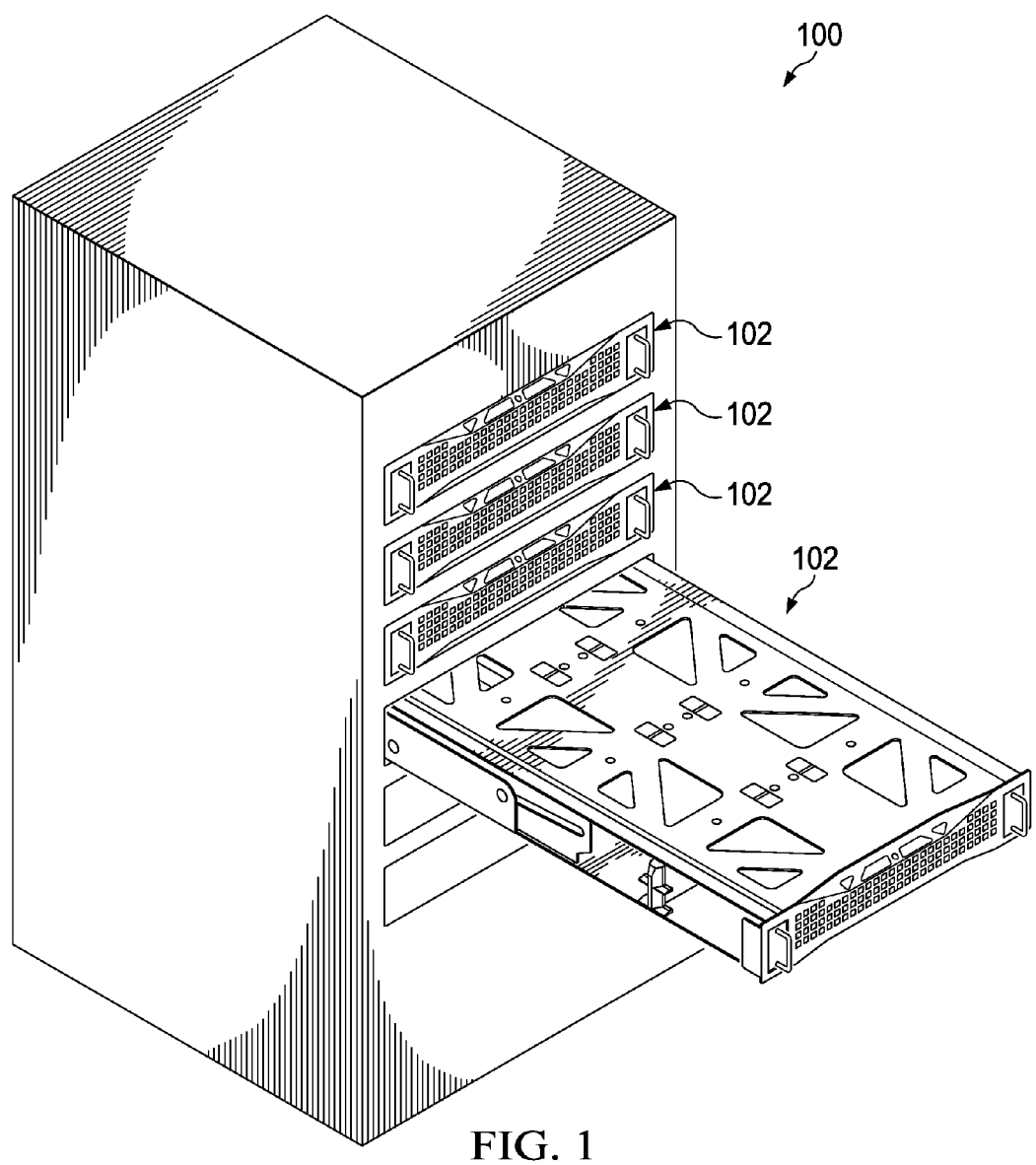
FIG. 1 illustrates a perspective view of a chassis for receiving modular information handling resources, in accordance with embodiments of the present disclosure.

FIG. 1 illustrates a perspective view of a chassis 100 for receiving modular information handling resources, in accordance with embodiments of the present disclosure.

Chassis 100 may be an enclosure that serves as a container for various information handling systems and information handling resources, and may be constructed from steel, aluminum, plastic, and/or any other suitable material. Although the term "chassis" is used, chassis 100 may also be referred to as a case, cabinet, tower, box, enclosure, and/or housing. In certain embodiments, chassis 100 may be configured to hold and/or provide power to a plurality of information handling systems and/or information handling resources. As depicted in FIG. 1, chassis 100 may include one or more drawers 102 for receiving information handling resources, as described in greater detail below.

Figure 2:
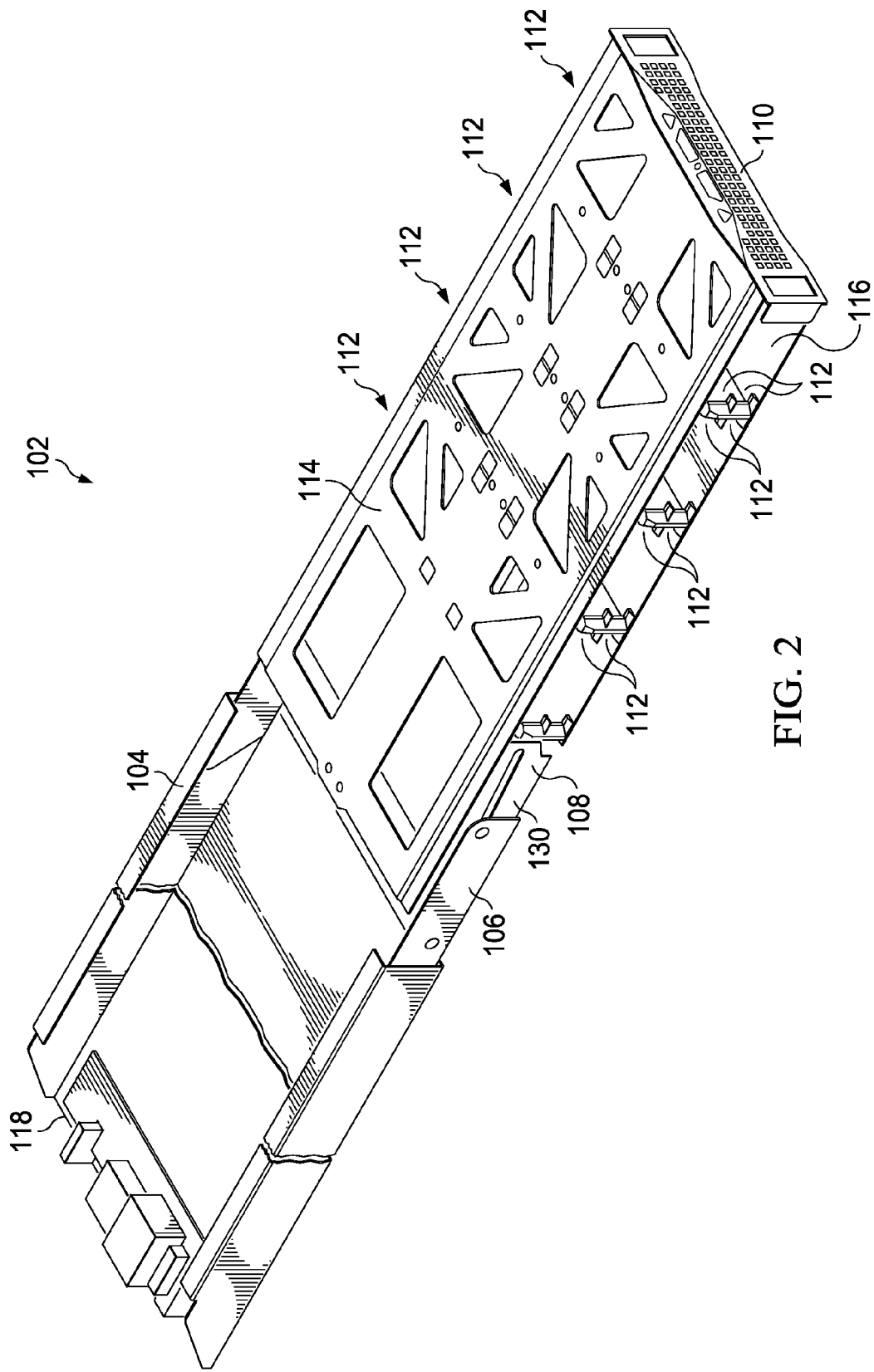
FIG. 2 illustrates a perspective view of an example chassis drawer for receiving modular information handling resources, the drawer in an open position, in accordance with embodiments of the present disclosure.
Figure 3:
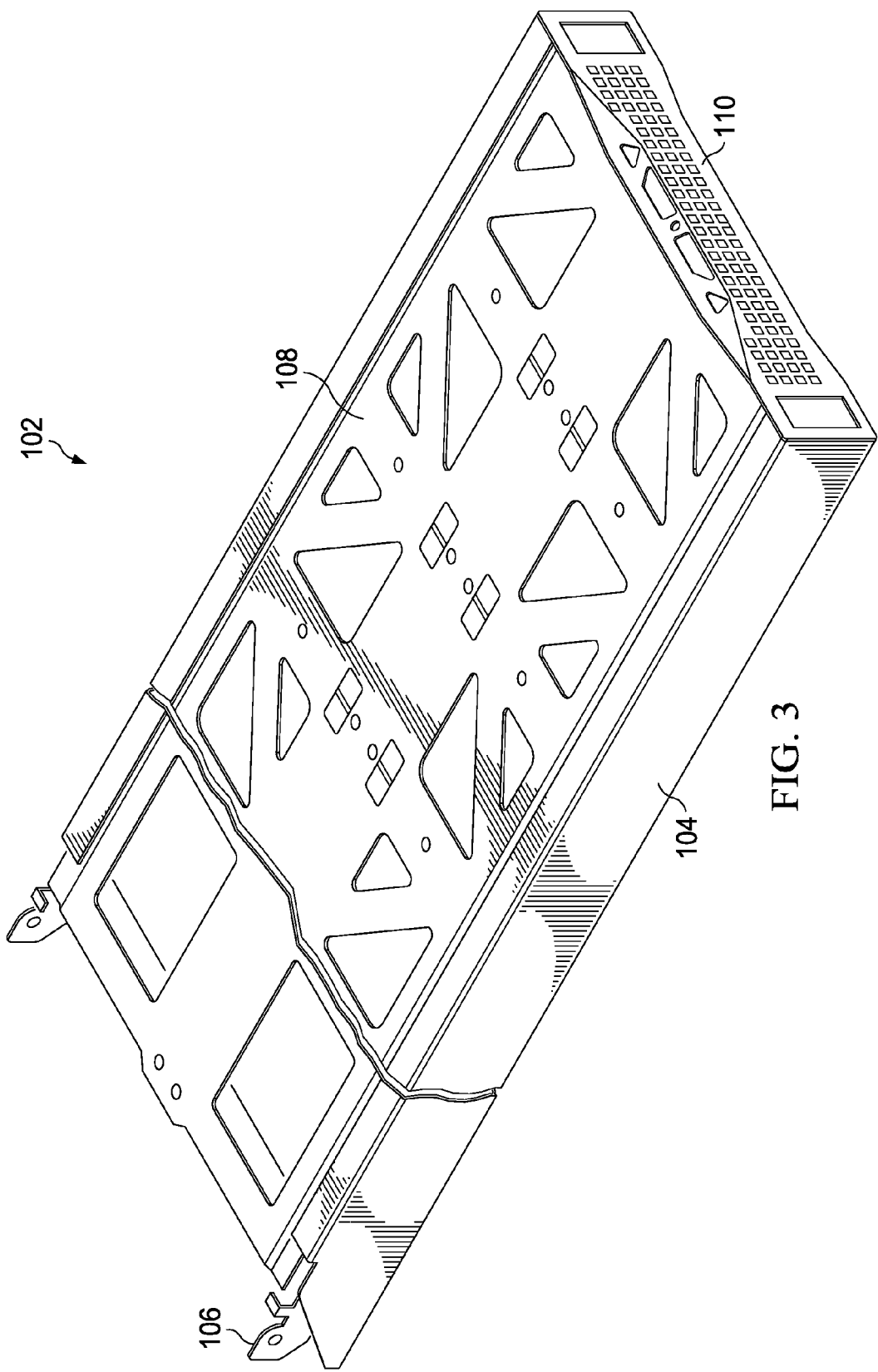
FIG. 3 illustrates a perspective view of an example chassis drawer for receiving modular information handling resources, the drawer in a closed position, in accordance with embodiments of the present disclosure.
Figure 4:
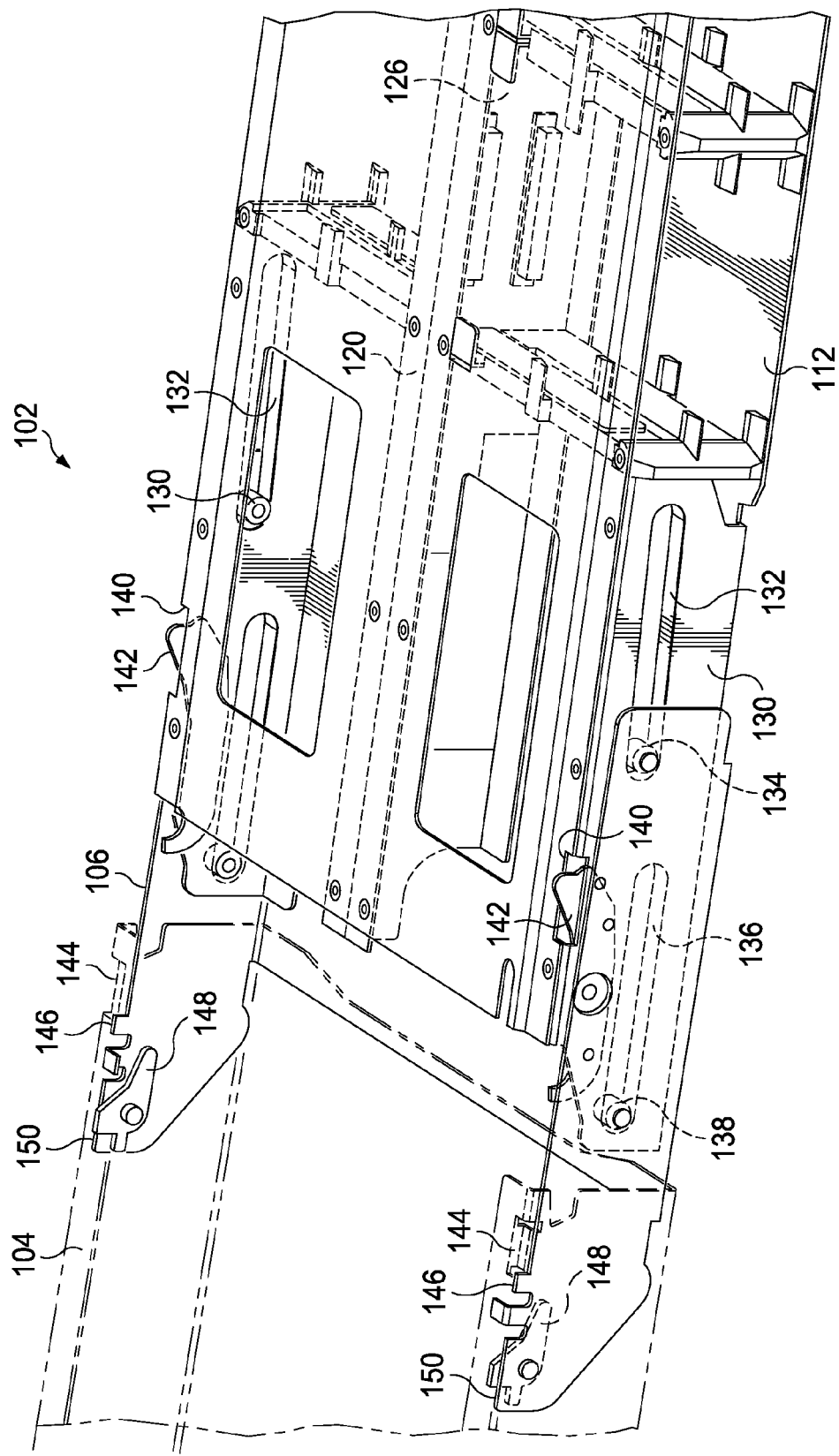
FIG. 4 illustrates a perspective view of selected components of the chassis drawer depicted in FIGS. 2 and 3, in accordance with embodiments of the present disclosure.
Figure 5:
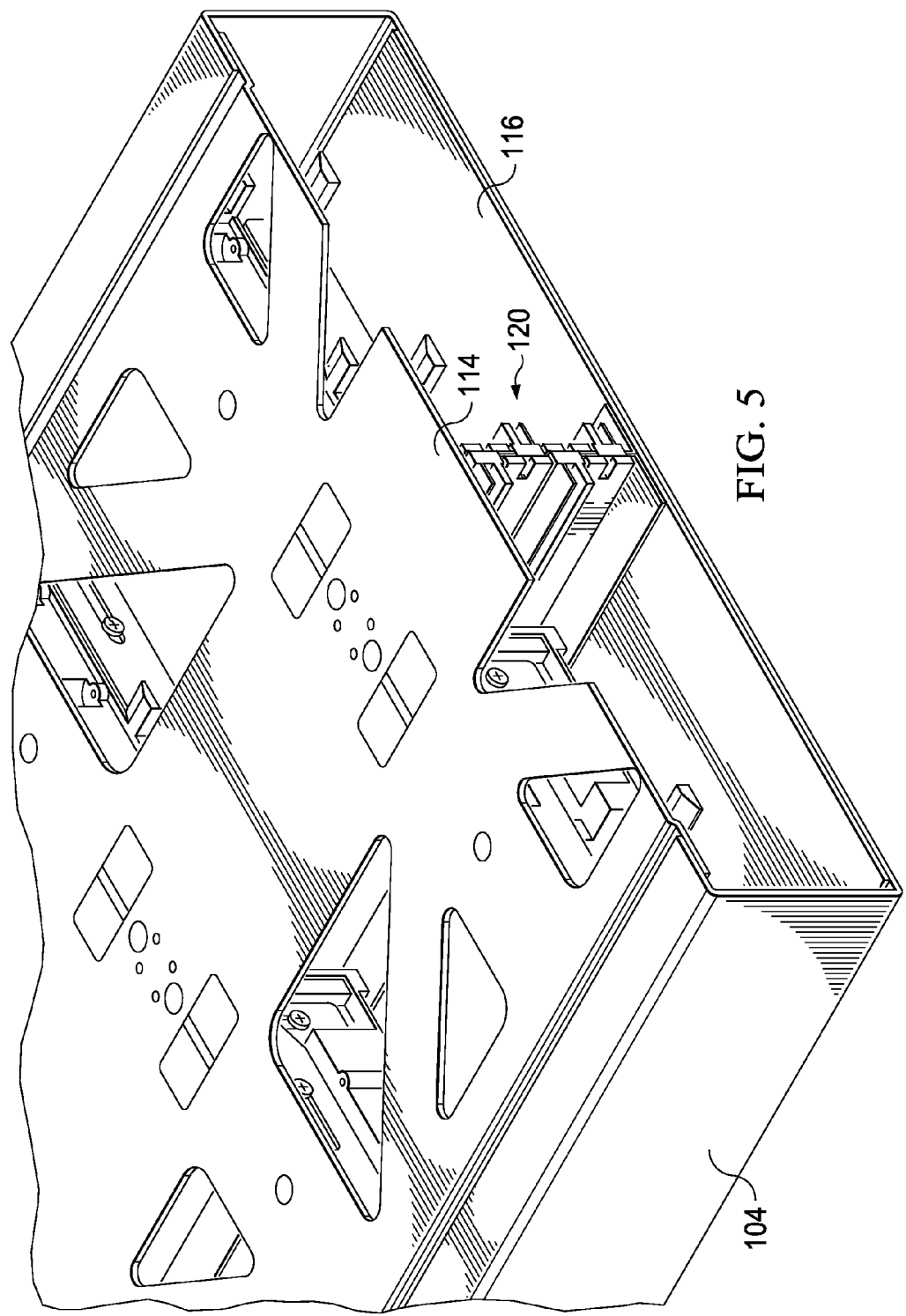
FIG. 5 illustrates a perspective view of selected components of an example carrier member of the chassis drawer depicted in FIGS. 2 and 3, in accordance with embodiments of the present disclosure.
Figure 6:
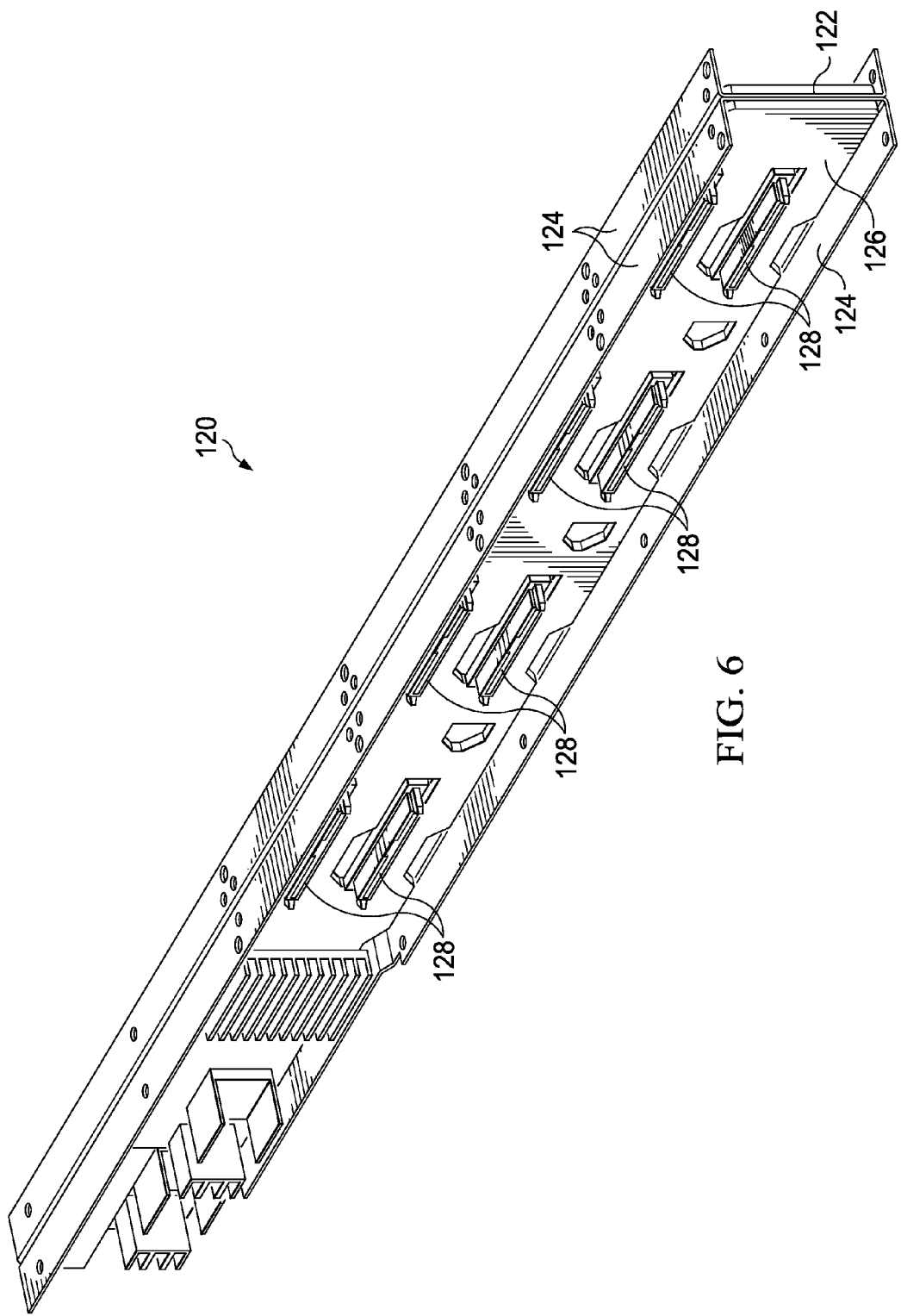
FIG. 6 illustrates a perspective view of an example center spine of the carrier member depicted in FIG. 5, in accordance with embodiments of the present disclosure.

FIGS. 2-6 depict various views of an example chassis drawer 102 for receiving modular information handling resources, in accordance with embodiments of the present disclosure. FIG. 2 illustrates a perspective view of an example chassis drawer 102 for receiving modular information handling resources, wherein drawer 102 is in an open position drawn from chassis 100, in accordance with embodiments of the present disclosure. FIG. 3 illustrates a perspective view of chassis drawer 102 for receiving modular information handling resources, wherein drawer 102 is in a closed position relative to chassis 100, in accordance with embodiments of the present disclosure. FIG. 4 illustrates a perspective view of selected components of chassis drawer 102 depicted in FIGS. 2 and 3, in accordance with embodiments of the present disclosure. FIG. 5 illustrates a perspective view of selected components of an example carrier member 108 of chassis drawer 102 depicted in FIGS. 2 and 3, in accordance with embodiments of the present disclosure. FIG. 6 illustrates a perspective view of an example center spine 120 of carrier member 108 depicted in FIG. 5, in accordance with embodiments of the present disclosure.

As shown in FIGS. 2-4, chassis drawer 102 may comprise an inner member 104, an intermediate member 106 mechanically coupled to inner member 104, and a carrier member 108 mechanically coupled to intermediate member 106. Inner member 104 may be constructed from steel, aluminum, plastic, and/or any other suitable material. Although inner member 104 may have any suitable size and/or shape, inner member 104 is depicted in the embodiments of FIGS. 2-4 as having two substantially planar and parallel opposite sides defining a drawer height coupled to each other by a substantially planar bottom generally perpendicular to the sides defining a drawer width and a guide flange extending from and running perpendicular to and along the length of each side such that the flanges project towards each other. In some embodiments, inner member 104 may be mechanically coupled to the internal mechanical structure of chassis 100, such that inner member 104 is fixed relative to chassis 100.

Intermediate member 106 may be constructed from steel, aluminum, plastic, and/or any other suitable material. Although intermediate member 106 may have any suitable size and/or shape, intermediate member 106 is depicted in the embodiments of FIGS. 2-4 as having two generally parallel and planar opposite sides coupled to each other by a substantially planar bottom generally perpendicular to the sides. The height of the sides and the width of the bottom may be such that the corresponding sides and bottom of inner member 104 provide a mechanical guide for intermediate member 106 as chassis drawer 102 is opened and closed. Intermediate member 106 may be mechanically coupled to inner member 104 via bearings and/or other mechanical components such that intermediate member 106 may slide relative to inner member 104 in a direction perpendicular to the drawer height and drawer width defined by inner member 104. As shown in FIG. 4, intermediate member 106 may be limited in the distance it may be drawn from chassis 100 through any combination of suitable structural elements. For example, in the embodiments represented by FIG. 4, translational movement of intermediate member 106 from the chassis may be limited by flanges 146 extending from the sides of intermediate member 106 and towards each other and corresponding depressions 144 formed at the interior corner of inner member 104 defined by a side and flange of inner member 104. Similarly, other mechanical components may restrict motion of intermediate member 106 relative to inner member 104 as chassis drawer 102 is translated from the open position to the closed position. For example, in the embodiments represented by FIG. 4, intermediate member 104 may have one or more spring-loaded cams 148 mounted to the an interior of the sides of intermediate member 104. As chassis drawer 102 is translated from a closed position to an open position, a projection of cam 148 may, as a result of spring force, engage with a corresponding opening 150 of a flange 146 of inner member 104. Accordingly, cam 148 may lock the motion of intermediate member 106 relative to inner member 104 until, upon translation of chassis drawer 102 from the open position to the closed position, carrier member 108 or another component of chassis drawer 102 engages with cam 148 to cause the projection of cam 148 to disengage from opening 150, allowing intermediate member 106 to again slide relative to inner member 104.

Carrier member 108 may be constructed from steel, aluminum, plastic, and/or any other suitable material. Although carrier member 108 may have any suitable size and/or shape, carrier member 108 is depicted in the embodiments of FIGS. 2-5 as having a substantially planar top 114 and a substantially planar bottom 116 generally parallel to each other defining a width and depth of carrier member 108, the top 114 and bottom 116 mechanically coupled to each other by a carrier spine 120 defining a height of carrier member 108, such that top 114 and bottom 116 are generally perpendicular to the sides of intermediate member 106. In some embodiments, carrier spine 120 may run a portion of the depth of carrier member 108 such that in such portion, carrier spine 120 is located at approximately the center of the width of carrier member 108. Carrier member 108 may also include a face 110 mechanically affixed to top 114, bottom 116, and/or carrier spine 120. As shown in FIGS. 2-5, top 114 may include one or more openings (e.g., above bays 112) allowing for gaseous fluid to pass through. Similarly, bottom 116 may also include one or more openings (e.g., below bays 112) allowing for gaseous fluid to pass through.

In some embodiments, face 110 may be substantially equal to the width of carrier member 108 and substantially equal to the height of carrier member 108. In these and other embodiments, face 110 may include handles, pull tabs, and/or other features allowing a person to pull on face 110 in order to translate chassis drawer 102 from a closed position to an open position in a direction generally parallel to the depth of top 114 and bottom 116. In these and other embodiments, face 110 may include a grill, vent, and/or other opening allowing gaseous fluid to enter and/or exit through face 110.

As shown in FIGS. 2 and 4, each side of carrier member 108 (e.g., portions of carrier member 108 between the edges of top 114 and bottom 116 and parallel to carrier spine 120) may include a web 130 configured to mechanically couple carrier member 108 to intermediate member 106, as well as openings for a plurality of bays 112. As shown in the embodiments represented by FIG. 4, web 130 of carrier member 108 may have openings 132 and 136 configured to engage with bearings 134 and 138, respectively of intermediate member 106. Accordingly, openings 132 and 136 may restrict movement of carrier member 108 relative to intermediate member 106.

Similarly, other mechanical components may restrict motion of carrier member 108 relative to intermediate member 106 as chassis drawer 102 is translated from the closed position to the open position. For example, in the embodiments represented by FIG. 4, carrier member 108 may have a cam 142 mechanically coupled to one or both of the opposite sides of carrier member 108. A spring force of cam 142 may bias cam 142 such that portion thereof extends through a corresponding opening 140 of carrier member 108. While chassis drawer 102 is translated from an open position to a closed position, cam 142 may be rotated via mechanical interaction of guide flanges of inner member 104 with an end of cam 142 extending through opening 140. Such rotation may cause an opposite end of cam 142 to engage with cam 148 of inner member 104 (e.g. near opening 150), thus restricting movement of carrier member 108 relative to intermediate member 106 in the outward direction of chassis drawer 102. Accordingly, when chassis drawer 102 is translated from a closed position to an open position, cam 142 may remain engaged with cam 148 until such time as carrier member 108 is withdrawn sufficiently so as to allow cam 142 to rotate through opening 140 to its spring-biased position, such that chassis member 108 is movable relative to intermediate member 106.

Also, as depicted in FIG. 4, openings 132 and/or 136 may be sloped so that as chassis drawer 102 is opened, the engagement of bearings 134 and/or 138 with openings 132 and/or 136, respectively, may cause carrier member 108 to tilt slightly upward from chassis 100 to face 110, in order to counteract the downward force caused by the weight of chassis drawer 102 and the various information handling resources disposed therein.

In the embodiments represented by FIG. 6, carrier spine 120 may include a substantially planar center member 122 and two flanges 124 generally perpendicular to center member 122 and projecting from each other on a top edge of center member 122 and two flanges 124 generally perpendicular to center member 122 and projecting from each other on a bottom edge of center member 122, the bottom edge opposite the top edge. Accordingly, carrier spine 120 may be structurally similar to an I-beam. In some embodiments, center member 122 and flanges 124 may be formed from the same piece of material. In other embodiments, center member 122 and flanges 124 may be formed from different pieces of material. For example, in some embodiments, carrier spine 120 may be constructed of two U-shaped pieces configured back to back and attached to each other via adhesive and/or mechanical fasteners. In these and other embodiments, flanges 124 may include one or more openings for receiving mechanical fasteners to mechanically couple flanges 124 to top 114 or bottom 116 via corresponding openings in top 114 or bottom 116.

As shown in FIGS. 4-6, a backplane 126 may be mechanically coupled to carrier spine 120. Backplane 126 may comprise any system, device, or apparatus configured to interconnect modular information handling resources inserted into bays 112 (e.g., hard disk drives) with each other and/or to other information handling resources of chassis 100. Accordingly, backplane 126 may include slots 128 and/or other connectors configured to receive corresponding electrical connectors of information handling resources in order to electrically couple information handling resources inserted into bays 112 to backplane 126. In some embodiments, backplane 126 may be configured to receive information handling resources on each side of center member 122, such that information handling resources on opposite sides of center member 122 are oriented "back-to-back" with respect to each other. In these and other embodiments, backplane 126 may comprise either a single printed circuit board coupled to center spine 120 with slots 128 mounted to each side or may comprise two electrically separate printed circuit boards coupled to center spine 120 in a back-to-back manner with slots 128 mounted on each printed circuit board. In some embodiments, one or more printed circuit boards comprising backplane 126 may form all or a portion of center member 122 and may comprise all or a portion of the mechanical structure for supporting the various flanges 124 of carrier spine 120.

In some embodiments, all slots 128 of backplane 126 may be configured to receive identical or similar information handling resources having substantially similar form factors and/or functionality (e.g., 2.5-inch hard disk drives). In other embodiments, some slots 128 may be configured to receive an information handling resource different in form factor and/or functionality than that for which another slot 128 is configured.

As shown in FIG. 2, chassis drawer 102 may have an interface connector 118 configured to electrically couple to backplane 126 when chassis drawer 102 is closed thus providing electrical coupling between information handling resources disposed in bays 112 and other information handling resources of chassis 100.

As shown in FIG. 2, carrier member 108 may have a plurality of bays 112 opening to each side of carrier member 108. Each of such bays 112 may be defined by an associated backplane 126 and one or more structural elements of carrier member 108. Accordingly, a bay 112 may include a suitable combination of structural elements configured to mechanically mate with an information handling resource to allow components of the information handling resource to electrically couple to backplane 126 when such information handling resource is received into the bay 112. A bay 112 may also be configured to allow modular information handling resources to be easily inserted and removed from the bay 112 as desired by a user.

Although carrier member 108 may be constructed so as to support any suitable arrangement of bays 112, in the embodiments represented by FIGS. 2 and 4, carrier member 108 is configured with 16 bays 112, eight on each side of carrier spine 120 and arranged on each side of carrier spine 120 such that two drives may be oriented one over the other in each of four openings.

In some embodiments, all bays 112 of carrier member 108 may be configured to receive identical or similar information handling resources having substantially similar form factors and/or functionality (e.g., 2.5-inch hard disk drives). In other embodiments, some bays 112 may be configured to receive an information handling resource different in form factor and/or functionality than that for which another bay 112 is configured.

Accordingly, drawer 102 may be drawn open allowing full-extension of carrier member 108 such that a person may access bays 112 to add and/or remove information handling resources from drawer 102. In addition, drawer 102 may be closed such that carrier member 108 is substantially telescoped within the depth of inner member 104 such that face 110 is generally parallel with a side of chassis 100.

Figure 24:
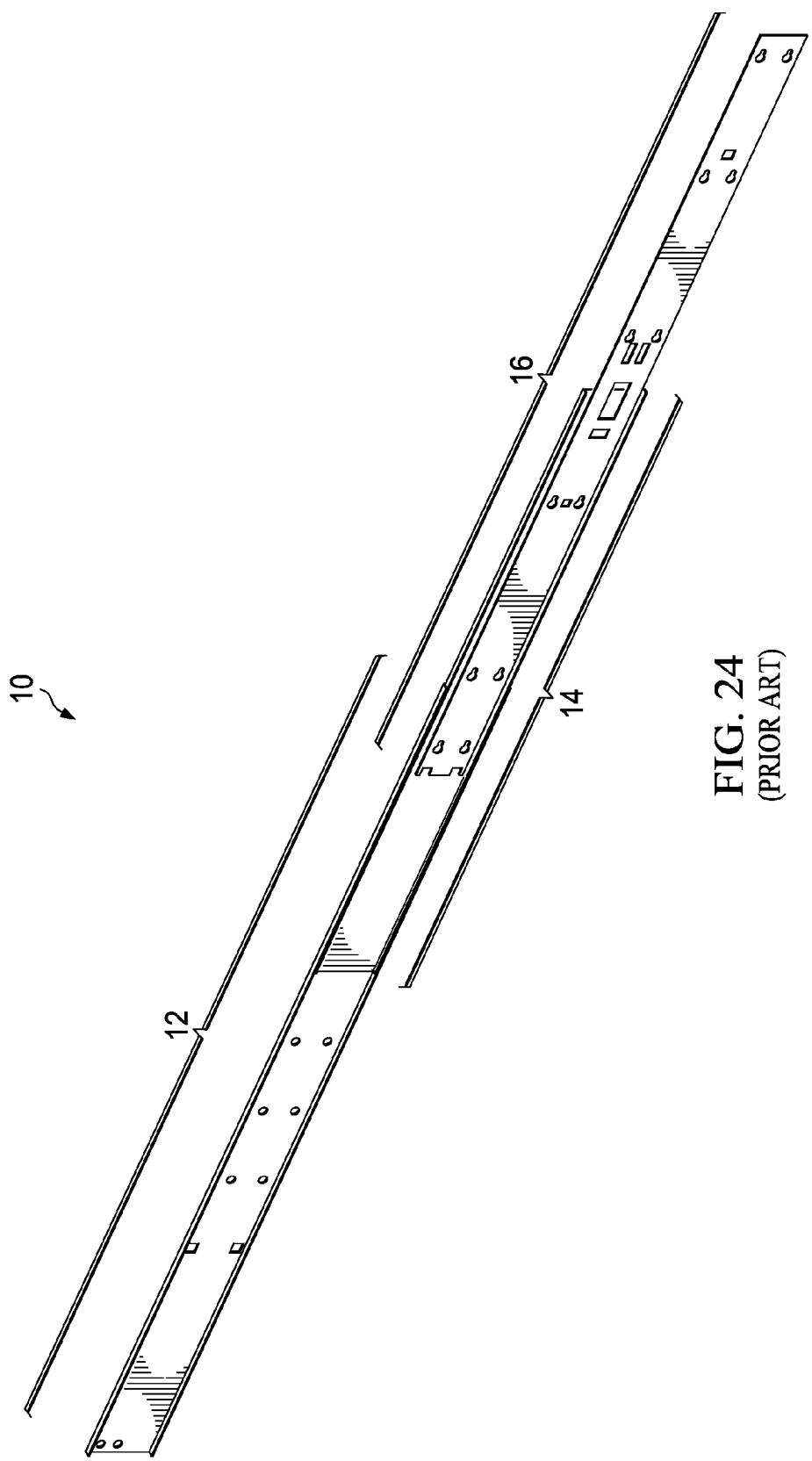
FIG. 24 illustrates a block diagram of an example rail system for use in a modular chassis, as is known in the art.

One or more advantages of chassis drawer 102 may be illustrated by referring to drawer slide 10 depicted in FIG. 24. As shown in FIG. 24, traditional full-extension drawer slides comprise an inner member 12, an intermediate member 14, and an external member 16. Typically, when coupled to a drawer, external member 16 runs a substantial portion of the depth of the side of the drawer. Thus, such an arrangement would make a drawer with side access to contents of the drawer difficult to construct, as the sides would need to be made larger in height to accommodate both the drawer slide and access to contents. Advantageously, chassis drawer 102 as described herein provides for full extension of a drawer, while essentially moving most of the structural support provided by an external member of a drawer slide to carrier spine 120 of chassis drawer 102, thus providing access to the sides of chassis drawer 102 while maintaining height of chassis drawer 102 substantially equal to that of the information handling resources to be installed in chassis drawer 102.

As described above, backplane 126 may be configured in any suitable manner for receiving information handling resources on each of the two sides of backplane 126. Examples of various embodiments of backplane 126 are described in greater detail below with respect to FIGS. 7-14.

Figure 7:
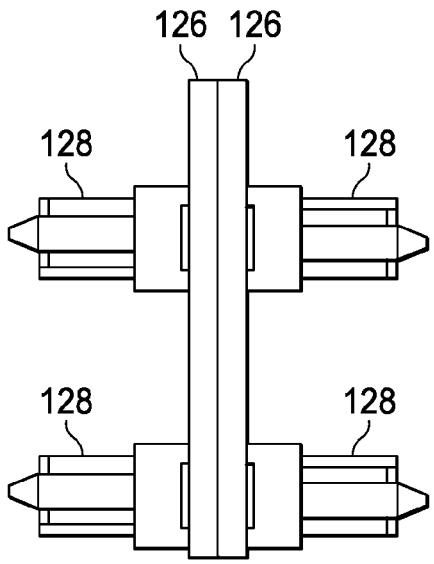
FIG. 7 illustrates a cross-sectional elevation view of an example backplane for use in the chassis drawer depicted in FIGS. 1-6, in accordance with embodiments of the present disclosure.

FIG. 7 illustrates a cross-sectional elevation view of an example backplane 126, in accordance with embodiments of the present disclosure. In the example shown in FIG. 7, backplane 126 may comprise two printed circuit boards each having slots 128 mounted to a surface thereof. Such printed circuit boards may be oriented back to back, such that modular information handling resources may be inserted on the opposite sides of backplane 126.

Figure 8:
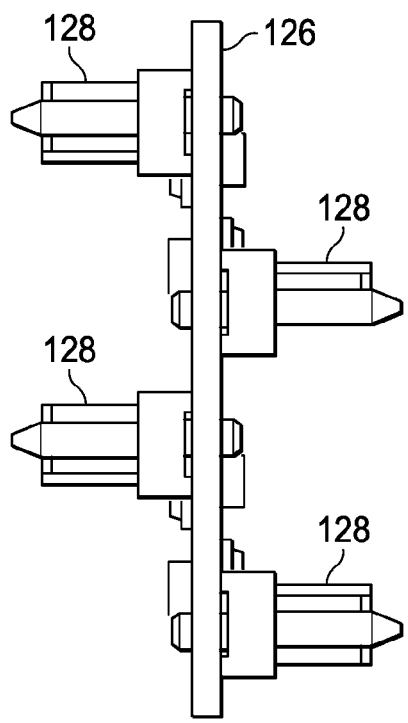
FIG. 8 illustrates a cross-sectional elevation view of another example backplane for use in the chassis drawer depicted in FIGS. 1-6, in accordance with embodiments of the present disclosure.

FIG. 8 illustrates a cross-sectional elevation view of another example backplane 126, in accordance with embodiments of the present disclosure. In the example shown in FIG. 8, backplane 126 may comprise a single printed circuit board having slots 128 mounted to each surface thereof. Thus, by using a single printed circuit board, rather than two printed circuit boards as shown in FIG. 7, the example backplane 126 of FIG. 8 may conserve space and/or may be less costly to produce. In order to accommodate information handling resources of a similar form factor in the slots 128 mounted to each surface, slots 128 on a first surface of the printed circuit board may be offset from adjacent slots 128 on an opposite second surface of the second printed circuit board such that mounting features of each slot 128 may pass through backplane 126. In addition, slots 128 on the first surface of the first printed circuit board, in addition to being offset from adjacent slots 128 on the opposite second surface of the second printed circuit board, may also be rotated approximately 180 degrees from adjacent slots 128 on the opposite second surface. Such rotation of slots 128 may be useful for information handling resources having connectors configured to mate with slots 128, wherein such connectors are arranged along only a portion of a rear edge of such information handling resource, thus potentially reducing the physical height required by the example backplane 126 depicted in FIG. 8 over embodiments in which such rotation is not employed.

Figure 9:
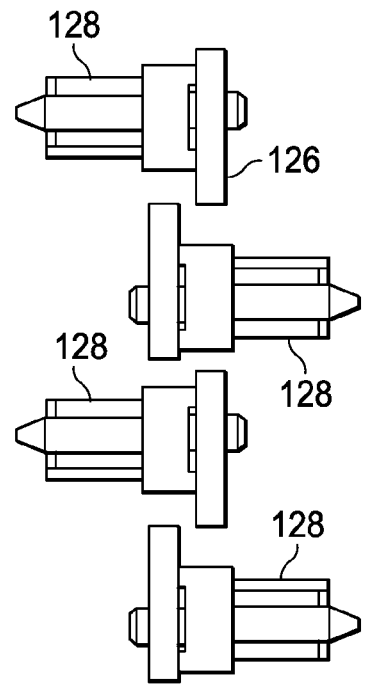
FIG. 9 illustrates a cross-sectional elevation view of yet another example backplane for use in the chassis drawer depicted in FIGS. 1-6, in accordance with embodiments of the present disclosure.

FIG. 9 illustrates a cross-sectional elevation view of yet another example backplane 126, in accordance with embodiments of the present disclosure. In the example shown in FIG. 9, backplane 126 may comprise two or more printed circuit boards each having slots 128 mounted to a surface thereof. In addition, the two or more printed circuit boards of backplane 126 may be oriented and/or may have openings formed therein such that as so oriented, the printed circuit boards define openings in backplane 126 allowing slots 128 to pass through such that the printed circuit boards and their slots 128 are in a nested, overlapping configuration within each other, rather than a non-overlapping configuration, such as that depicted in FIG. 7. In other words, in the example backplane 126 of FIG. 9, backplane 126 includes at least a first printed circuit board and a second printed circuit board, the first printed circuit board having at least a first slot 128 mounted to a first surface of the first printed circuit board and the second printed circuit board having at least a second slot 128 mounted to a second surface of the second printed circuit board. The first printed circuit board and the second printed circuit board are arranged such that the first slot passes through a plane defined by the second surface and the second slot passes through a plane defined by the first surface. Example embodiments of backplane 126 depicted in FIG. 9 are illustrated in FIGS. 10-13.

Figure 10:
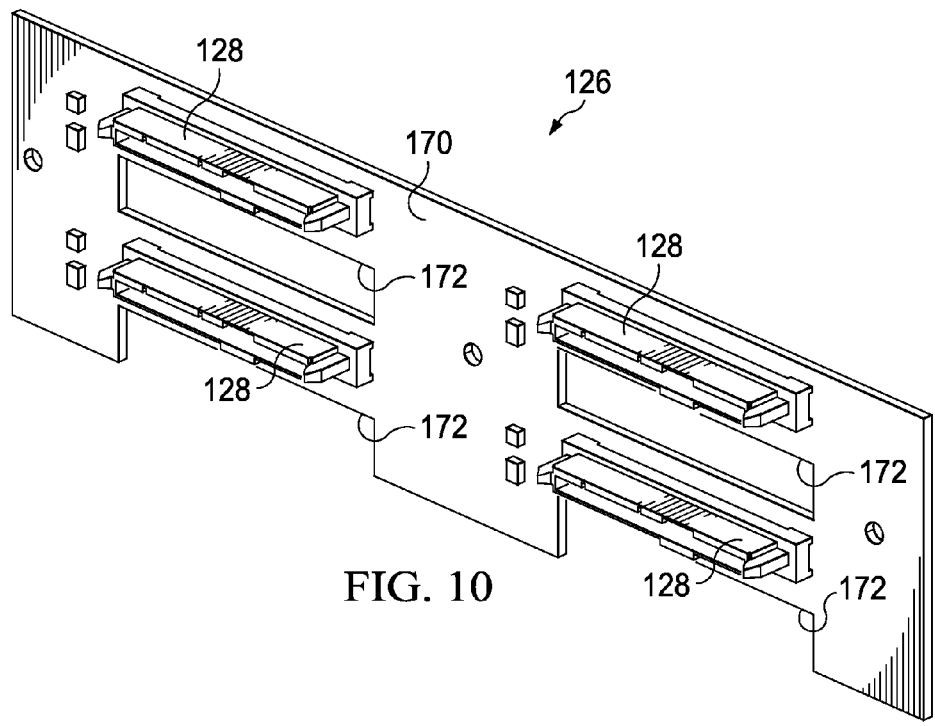
FIG. 10 illustrates a perspective view of selected components of particular embodiments of the example backplane depicted in FIG. 9, in accordance with the present disclosure.
Figure 11:
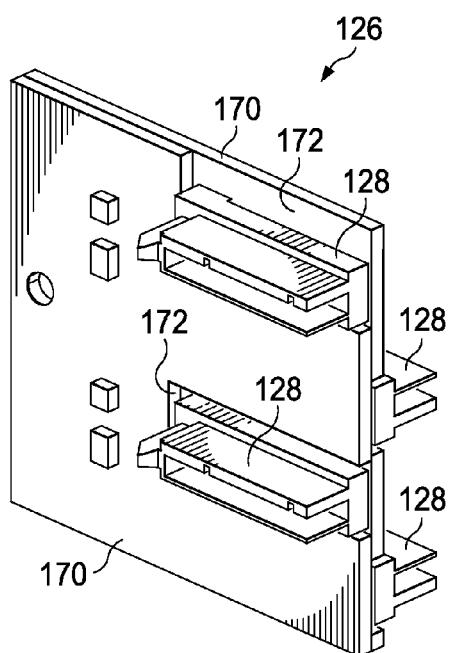
FIG. 11 illustrates a perspective view of the example backplane depicted in FIG. 9 implementing the particular embodiments depicted in FIG. 10, in accordance with the present disclosure.

FIG. 10 illustrates a perspective view of selected components of particular embodiments of the example backplane 126 depicted in FIG. 9, in accordance with the present disclosure. FIG. 11 illustrates a perspective view of the example backplane 126 depicted in FIG. 9 implementing the particular embodiments depicted in FIG. 10, in accordance with the present disclosure. As shown in FIGS. 10 and 11, backplane 126 may comprise two printed circuit boards 170 each having slots 128 mounted to a surface thereof and having one or more openings 172 formed therein. The two printed circuit boards may be oriented relative to each other such that slots 128 on one of the printed circuit boards 170 may pass through openings 172 of the other printed circuit board 170, and vice versa, as shown in FIG. 11.

Figure 12:
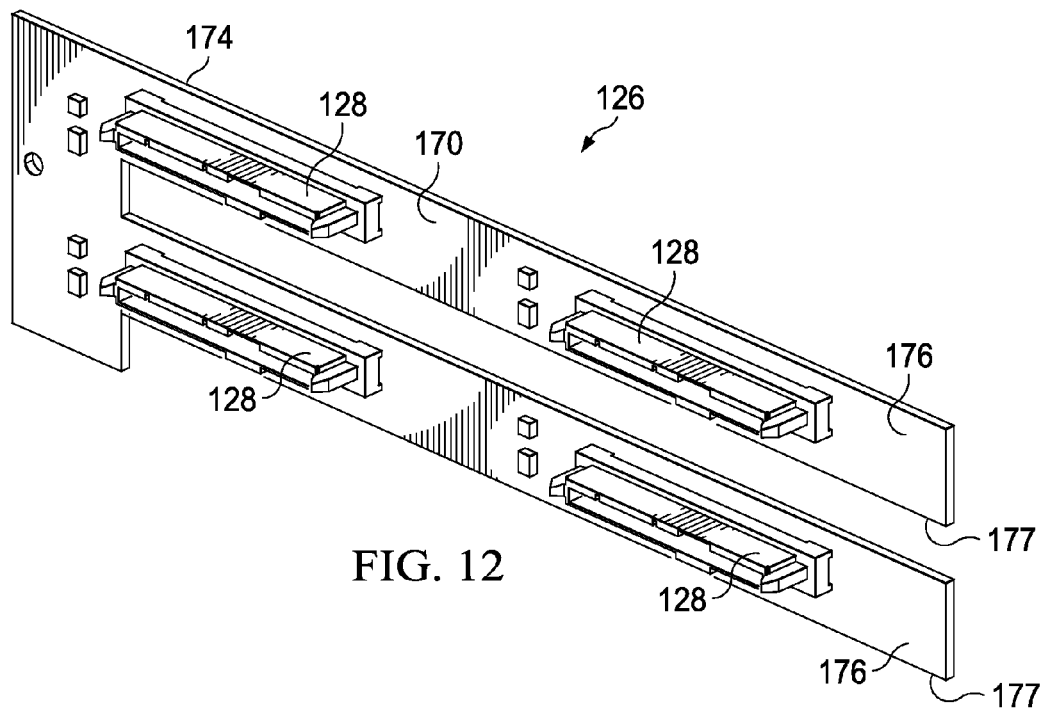
FIG. 12 illustrates a perspective view of selected components of other particular embodiments of the example backplane depicted in FIG. 9, in accordance with the present disclosure.

FIG. 12 illustrates a perspective view of selected components of other particular embodiments of the example backplane 126 depicted in FIG. 9, in accordance with the present disclosure. In the particular embodiments represented by FIG. 12, backplane 126 may comprise two printed circuit boards 174 (for clarity of exposition, only one printed circuit board 174 is depicted in FIG. 12). Each printed circuit board 174 may comprise a plurality of forks 176 each having one or more slots 128 mounted to a surface thereof and the various forks 176 defining openings 177. The two printed circuit boards may be oriented relative to each other such that slots 128 on one of the printed circuit boards 174 may pass through openings 177 of the other printed circuit board 174, and vice versa, in a manner similar to that shown in FIG. 11.

Figure 13:
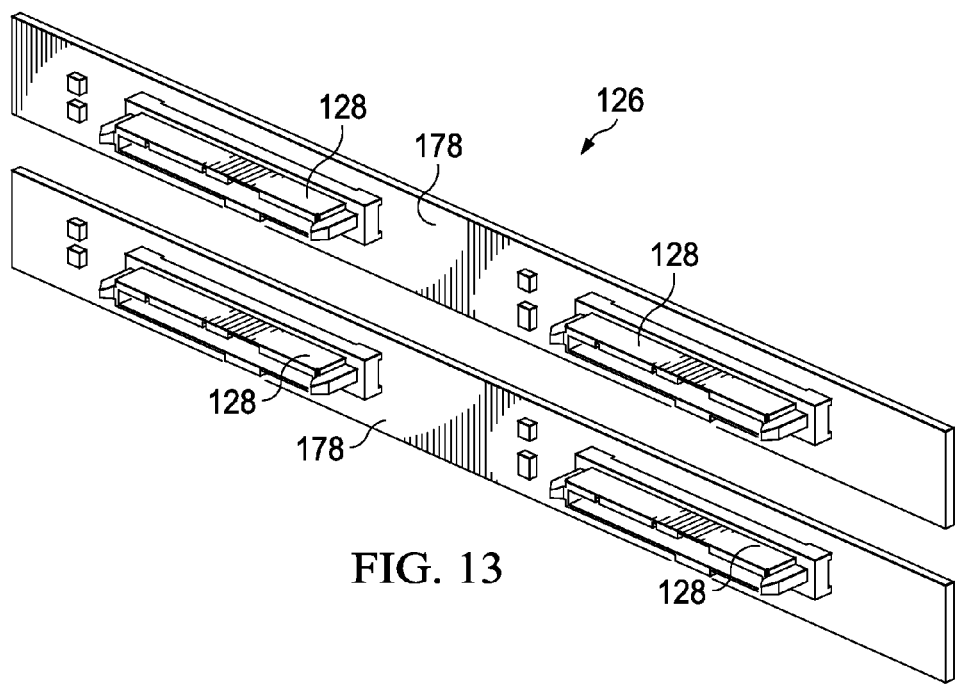
FIG. 13 illustrates a perspective view of selected components of yet other particular embodiments of the example backplane depicted in FIG. 9, in accordance with the present disclosure.

FIG. 13 illustrates a perspective view of selected components of yet other particular embodiments of the example backplane 126 depicted in FIG. 9, in accordance with the present disclosure. In the particular embodiments represented by FIG. 13, backplane 126 may comprise two or more printed circuit boards 178 (for clarity of exposition, only two printed circuit boards 178 having substantially co-planar surfaces with slots 128 mounted to such surfaces are shown in FIG. 13). The two or more printed circuit boards may be oriented relative to each other such that slots 128 on one of the printed circuit boards 178 may pass through a plane defined by the mounting surface of the other printed circuit board 178, and vice versa, in a manner similar to that shown in FIG. 11.

In the embodiments described above with respect to FIGS. 9-13, in order to accommodate information handling resources of a similar form factor in the slots 128 mounted to each side of backplane 126, slots 128 on one printed circuit board of backplane 126 may be offset from adjacent slots 128 on an opposite printed circuit board of backplane 126. In addition, slots 128 on one printed circuit board of backplane 126, in addition to being offset from adjacent slots 128 on the opposite printed circuit board of backplane 126, may also be rotated approximately 180 degrees from adjacent slots 128 of the opposite printed circuit board. Such rotation of slots 128 may be useful for information handling resources having connectors configured to mate with slots 128, wherein such connectors are arranged along only a portion of a rear edge of such information handling resource, thus potentially reducing the physical height required by the example backplane 126 depicted in FIG. 9-13 over embodiments in which such rotation is not employed.

Figure 14:
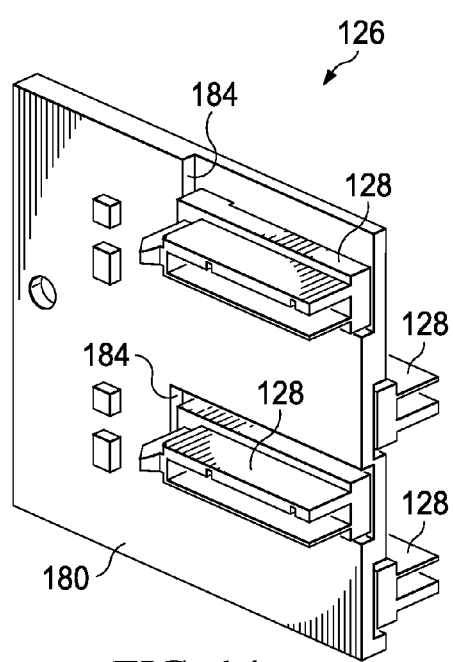
FIG. 14 illustrates a cross-sectional elevation view of yet another example backplane for use in the chassis drawer depicted in FIGS. 1-6, in accordance with embodiments of the present disclosure.

FIG. 14 illustrates a perspective view of selected components of yet another example backplane 126, in accordance with the present disclosure. In the example shown in FIG. 14, backplane 126 may comprise a single printed circuit board 180. Printed circuit board 180 may have a plurality of openings 184 formed in recessed areas below the surfaces on each side of printed circuit board 180 wherein slots 128 may be mounted. For example, printed circuit board layers may be omitted or removed in those areas in which slots 128 reside. In order to accommodate information handling resources of a similar form factor in opposite facing slots 128 of printed circuit board 180, slots 128 facing a first direction on printed circuit board 180 may be offset from opposite facing adjacent slots 128. In addition, slots 128 facing a first direction, in addition to being offset from opposite facing adjacent slots 128, may also be rotated approximately 180 degrees from opposite facing adjacent slots 128. Such rotation of slots 128 may be useful for information handling resources having connectors configured to mate with slots 128, wherein such connectors are arranged along only a portion of a rear edge of such information handling resource, thus potentially reducing the physical height required by the example backplane 126 depicted in FIG. 14 over embodiments in which such rotation is not employed.

The various embodiments depicted in FIGS. 9-14 may have further advantages over the embodiments depicted in FIGS. 7 and 8. For example, the embodiments represented by FIGS. 9-14 may provide a more compact layout of backplane 126, slots 128, and information handling resources than the embodiments represented by FIGS. 7 and 8.

Figure 15:
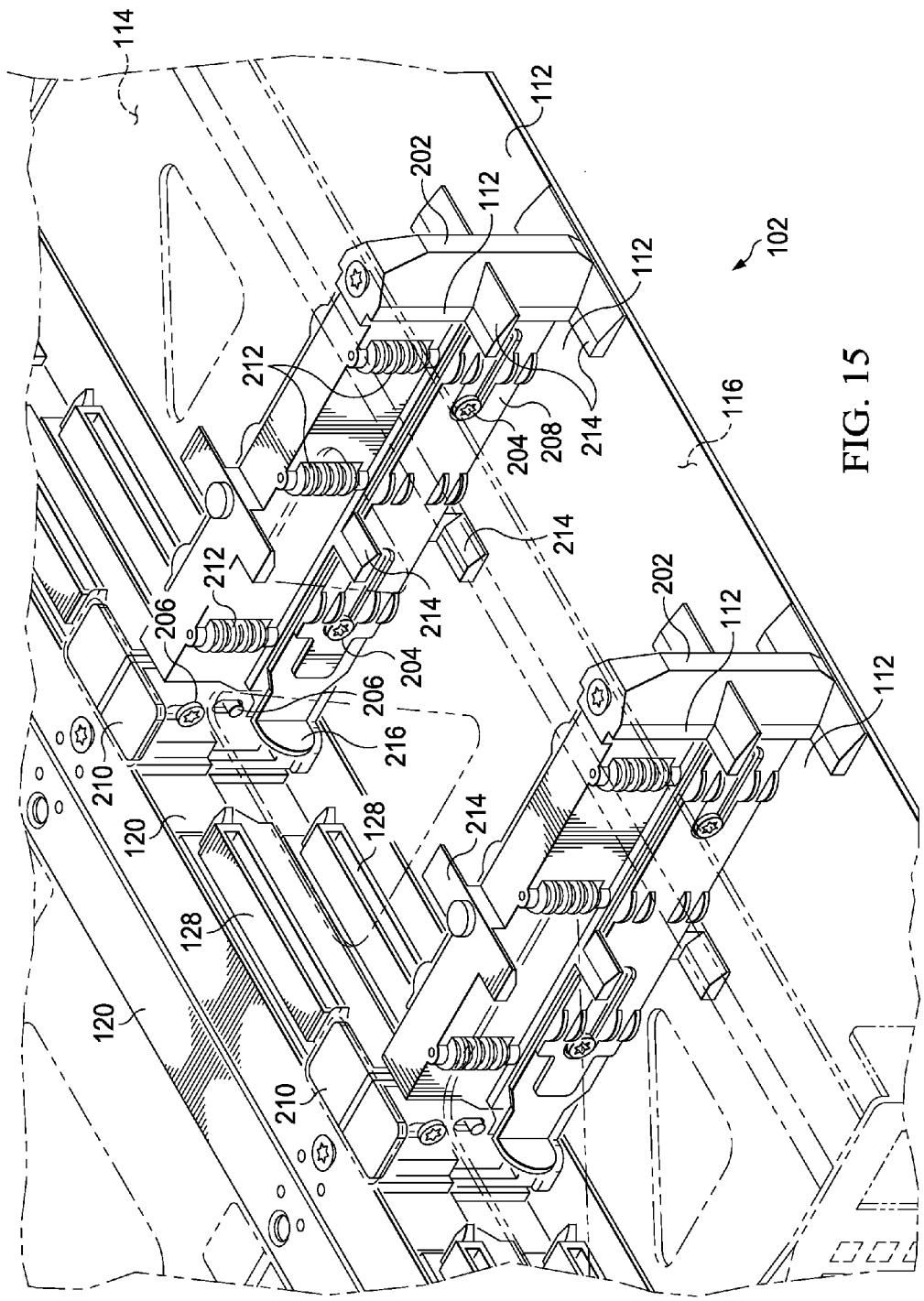
FIG. 15 illustrates a perspective view of selected components of the chassis drawer depicted in FIGS. 2 and 3 for inserting and removing an information handling resource from an individual bay of the chassis drawer, in accordance with embodiments of the present disclosure.

As described above, chassis drawer 102 may be utilized in order to provide for addition and removal of information handling resources from chassis 100. To illustrate addition and removal of an information handling resource from a bay 112 defined by chassis drawer 102, reference is made to FIGS. 15-19. FIG. 15 illustrates a perspective view of selected components of chassis drawer 102 for inserting and removing an information handling resource from an individual bay 112 of chassis drawer 102, in accordance with embodiments of the present disclosure. FIGS. 16-19 illustrate various perspective views of selected components of chassis drawer 102 depicting insertion of an information handling resource into an individual bay 112 of chassis drawer 102, in accordance with embodiments of the present disclosure.

As shown in FIGS. 15-19, chassis drawer 102 may include a plurality of support members 202, such that laterally adjacent bays 112 (e.g., bays 112 adjacent in a direction of the depth of carrier member 108) are separated by a support member 202. In addition, each support member 202 may have a plurality of guide flanges 214 for mechanically guiding an information handling resource into and out of a bay 112. In some embodiments, vertically adjacent bays 112 (e.g., bays 112 adjacent in a direction of the height of chassis drawer 102) may be separated by one or more guide flanges 214. Accordingly, support members 202 and their various guide flanges 214 (as well as, in some embodiments, backplane 126 and slots 128) may be appropriately sized, shaped, and arranged relative to each other so as to define the plurality of bays 112.

A support member 202 may have mechanically coupled thereto a slider 208 and slider bearings 204. A slider 208 may comprise one or more openings 224 configured to engage with bearings 204 such that slider 208 may move in and out of bay 112 substantially in a direction of the width of chassis drawer 102, with such movement limited by the size of openings 224. A support member 202 of a bay 112 may also comprise one or more vibrational dampers 212 such that the one or more vibrational dampers 212 are opposite a slider 208 mechanically coupled to an opposing support member 202 defining the same bay 112. As their name suggests, vibrational dampers 212 may dampen vibration generated by an information handling resource disposed in a bay 112 and/or generated elsewhere in chassis 100.

Figure 17:
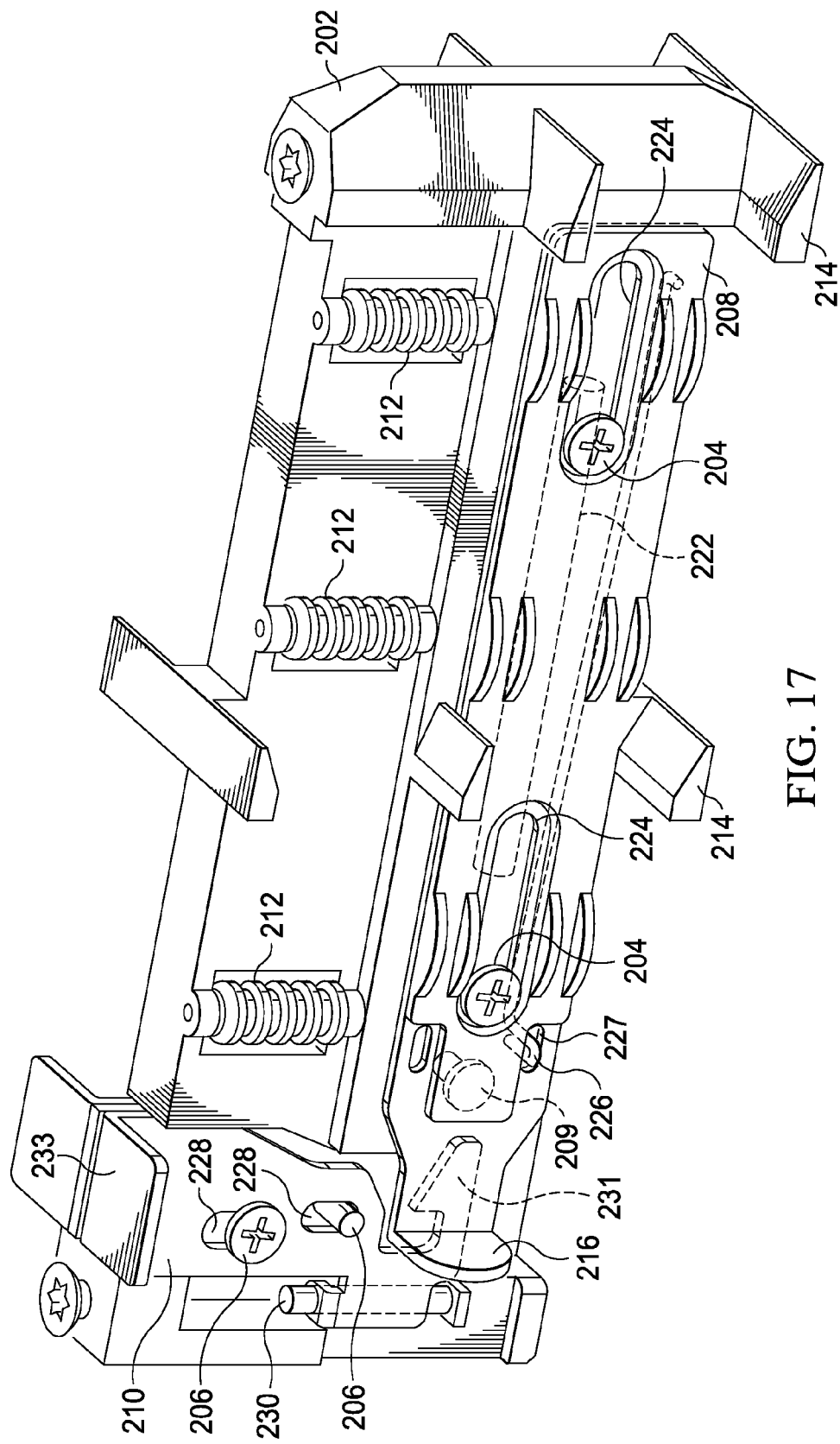

As shown in FIG. 17, an ejection spring 222 may be coupled between support member 202 and slider 208 such that the spring force of ejection spring 222 biases slider 208 to a particular position relative to support member 202 in the absence of force other than the spring force of ejection spring 222.

Figure 16:
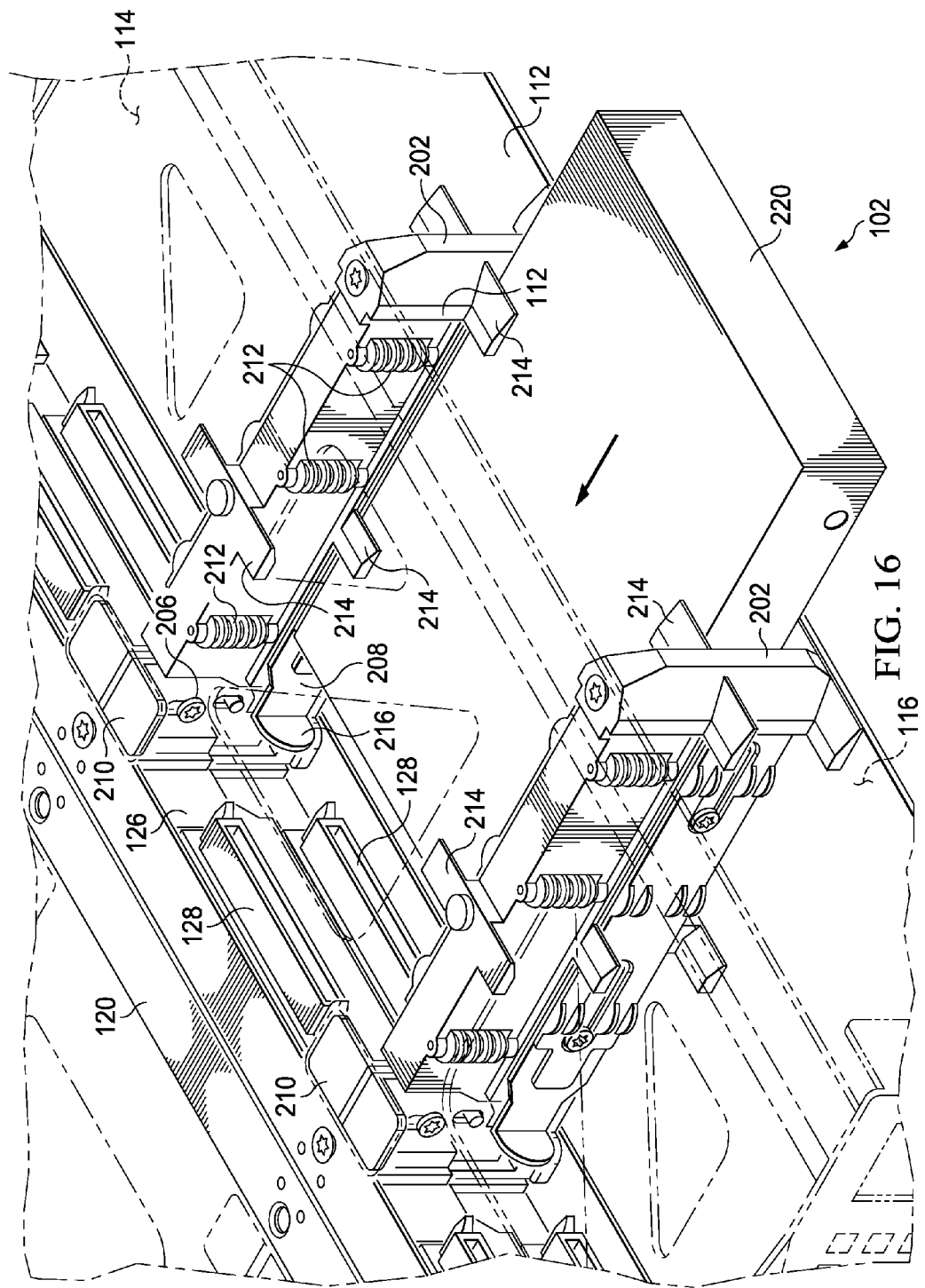
FIGS. 16-19 illustrate various perspective views of selected components of the chassis drawer depicted in FIGS. 2 and 3 depicting insertion of an information handling resource into an individual bay of the chassis drawer, in accordance with embodiments of the present disclosure.

As shown in FIG. 16, an information handling resource 220 (e.g., a hard disk drive) may be inserted into a bay 112, where its vertical and lateral movement may be restricted by guide flanges 214, slider 208, and/or vibrational dampers 212 such that information handling resource 220 moves substantially in the direction of the width of chassis drawer 102. During insertion, a force may be applied (e.g., by a person) to translate the information handling resource into a bay 112 until such time as information handling resource 220 mechanically engages with a slide flange 216 of slider 208.

After information handling resource 220 engages with slide flange 216, the force inserting information handling resource 220 into bay 112 may also cause slider 208 to slide about bearings 204 of support member 202 in the same direction of the motion of information handling resource 220, provided that such force is greater than the spring force of ejection spring 222.

Figure 18:
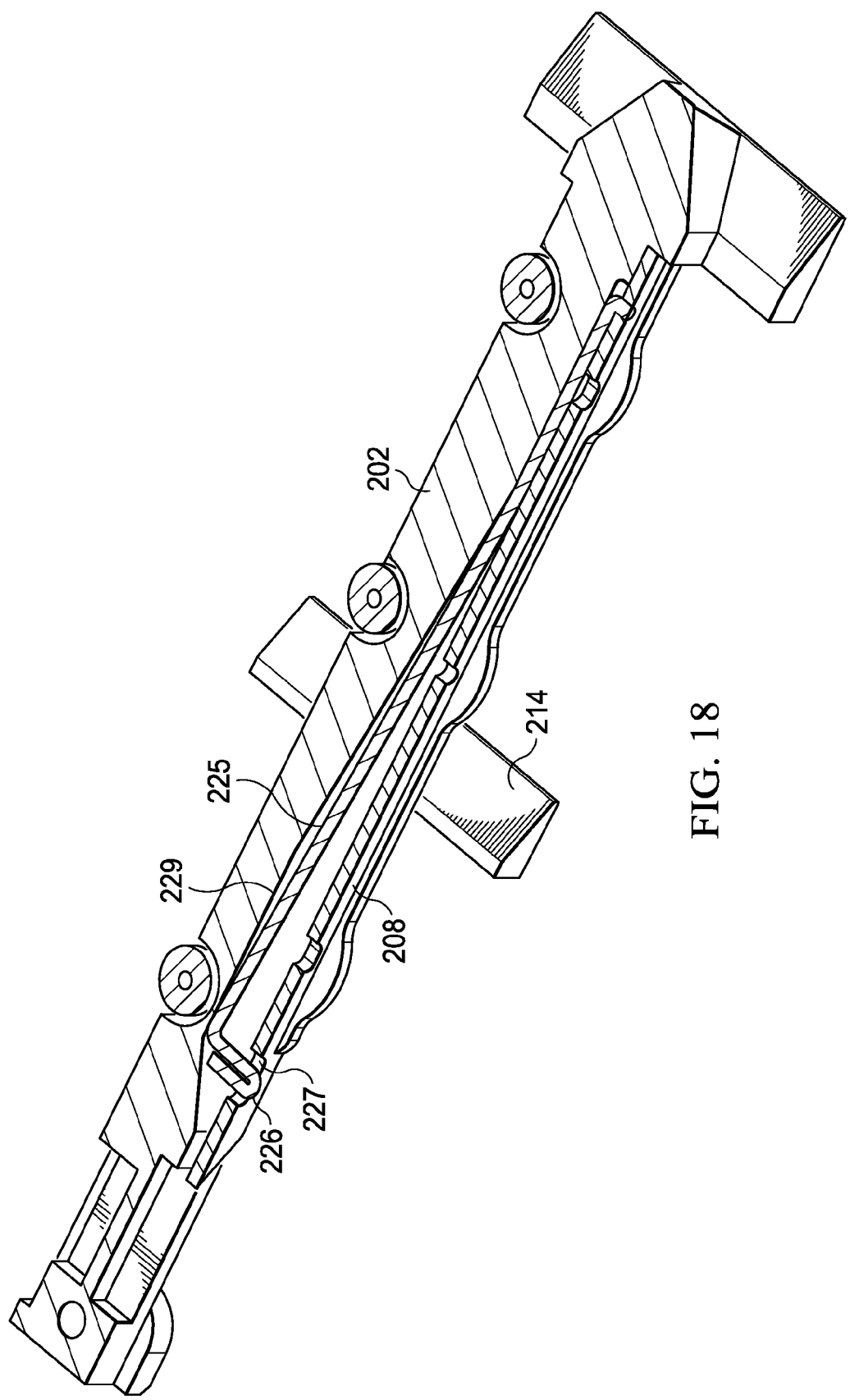

As shown in FIGS. 17 and 18, support member 202 may include a retention spring 225. Retention spring 225 may be mechanically coupled to slider 208 such that as slider 208 slides relative to support member 202, the motion of retention spring 225 in the direction of motion of slider 208 is fixed relative to slider 208. As shown in FIGS. 17 and 18, slider 208 may include a retention spring opening 227 configured to receive a flange 226 of retention spring 225. Retention spring 225 may have a spring force such that in the absence of forces other than the spring force, retention spring 225 is biased such that flange 226 does not engage with retention spring opening 227. However, support member 202 may include a spring engagement feature 229 (e.g., a structural contour formed in support member 202) configured to overcome the spring force, such that as slider 208 is translated during insertion of information handling resource 220, flange 226 engages with retention spring opening 227. Accordingly, as information handling resource 220 is inserted into bay 112 and causes slider 208 to translate relative to support member 202, flange 226 of retention spring 225 may engage with a corresponding feature (e.g., an opening) present on information handling resource 220, thereby preventing or reducing motion of information handling resource 220 relative to slider 208 while flange 226 is engaged with such opening.

Figure 19:
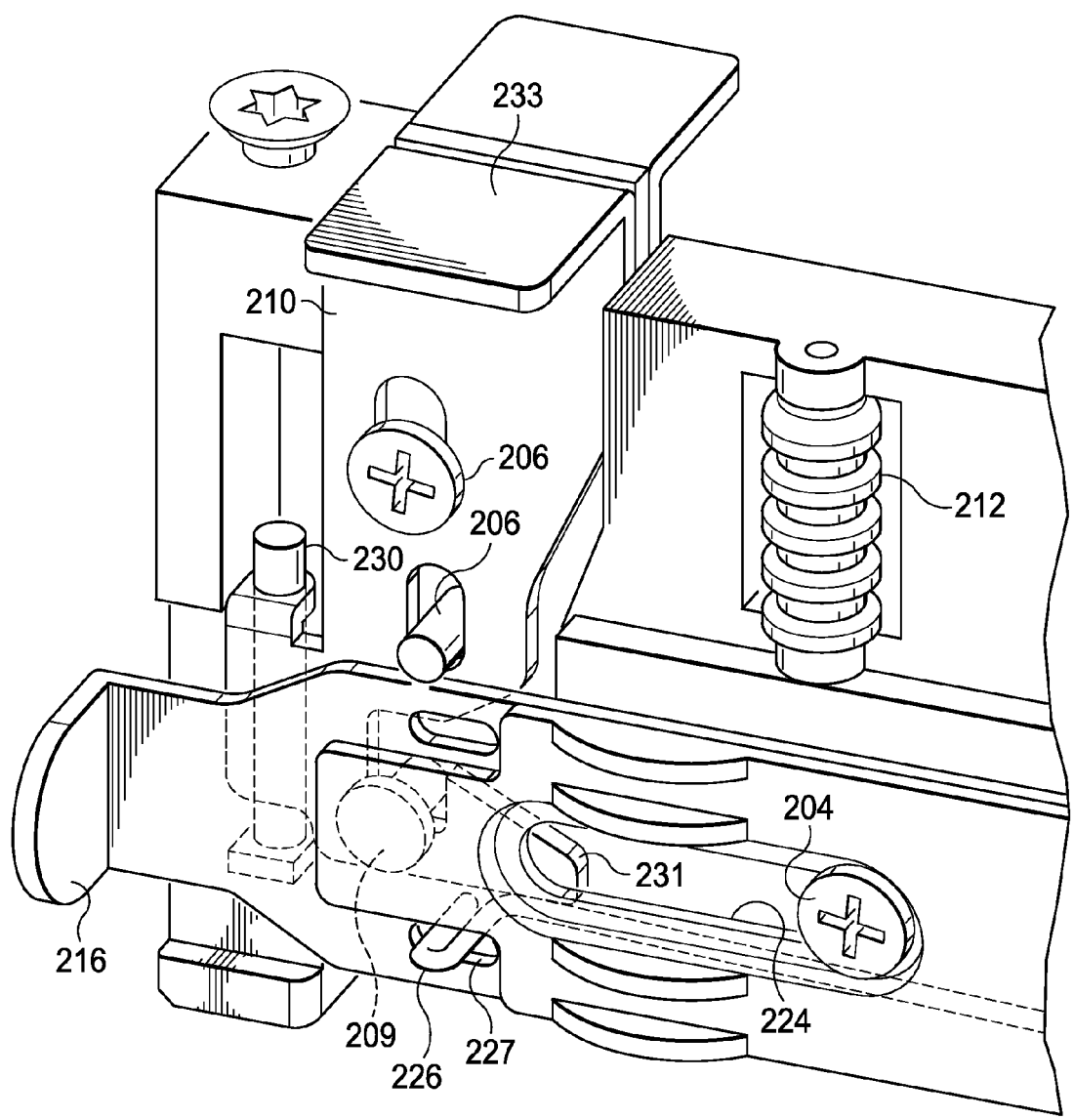

As shown in FIGS. 17 and 19, slider 208 may also include a slider post 209 coupled thereto and projecting therefrom. In addition, support member 202 may have mechanically coupled thereto a release latch 210 and bearings 206. Release latch 210 may comprise one or more openings 228 configured to engage with bearings 206 such that slider 208 may move substantially in a direction of the height of chassis drawer 102, with such movement limited by the size of openings 228.

As shown in FIGS. 17 and 19, a latch return spring 230 may be coupled between support member 202 and release latch 210 such that the spring force of latch return spring 230 biases slider release latch 210 to a particular position relative to support member 202 in the absence of force other than the spring force of latch return spring 230.

As information handling resource 220 is further inserted into bay 112 causing further translation of slider 208, slider post 209 may engage with release latch 210, such that the force of engagement between release latch 210 and slider post 209 overcomes the spring force of ejection spring 222, thus locking slider 208 (and likewise information handling resource 220) into a fixed position relative to support member 202, as depicted in FIG. 19. For example, in some embodiments release latch 210 may have a projection 231 appropriately sized and shaped such that as information handling resource 220 is inserted, slider post 209 engages with a slope of projection 231 that causes release latch 210 to move in a direction opposite of the spring force of latch return spring 230 and then engages with a valley of projection 231 such that the spring force of latch return spring 230 causes release latch 210 to return to its original position and engage with latch post 209 to prevent the spring force of ejection spring 222 from ejecting slider 208. In some embodiments, as slider post 209 engages with release latch 210, information handling resource 220 may engage with a slot 128, thus electrically coupling information handling resource 220 to backplane 126.

To remove information handling resource 220 from bay 112, a user may actuate release latch 210, for example, by applying a downward force on release latch flange 233 in a direction opposite to the spring force of latch return spring 230. As a result of such actuation, slider post 209 may disengage from release latch 210, causing slider 208 to eject under the force of ejection spring 222. As slider 208 translates under the force of ejection spring 222, the force of retention spring 225 causes flange 226 to disengage from information handling resource 220. As a result, information handling resource 220 may be partially ejected from bay 112, allowing a user to continue removal of information handling resource 220 by applying the necessary force.

Although chassis drawer 102 as described above may provide many advantages in terms of cost, density, and other factors, installations of a chassis may exist rendering usage of chassis drawer 102 impractical. For example, if a chassis were placed in a corner of a room, a wall of the room may prevent physical access to the sides of chassis drawer 102, thus preventing access to bays 112 for addition and removal of information handling resources. FIGS. 20-23 depict various selected components of a chassis drawer 302 for receiving modular information handling resources.

Figure 20:
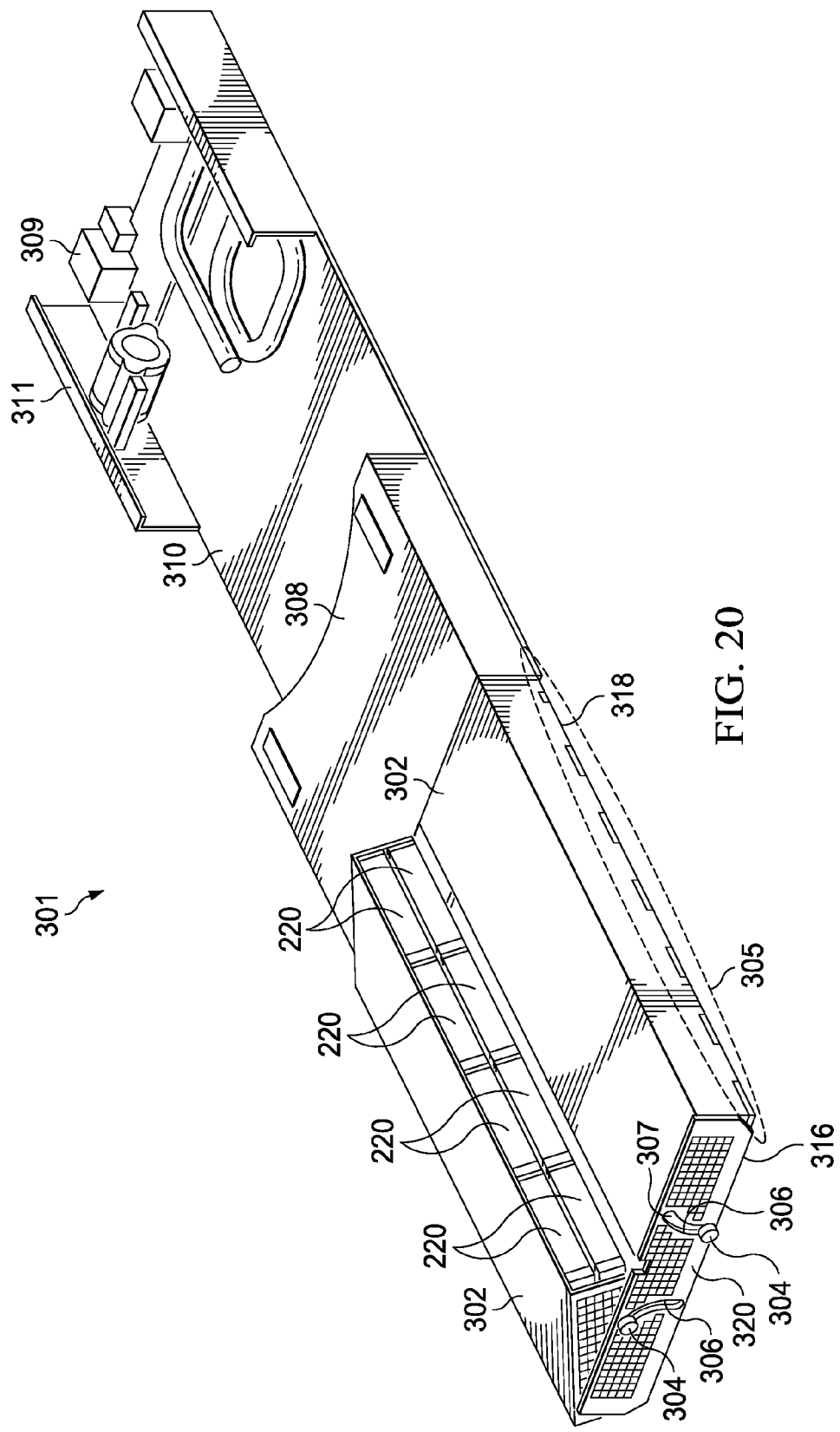
FIG. 20 illustrates a perspective view of an alternative embodiment of a chassis drawer for receiving modular information handling resources, in accordance with embodiments of the present disclosure.

FIG. 20 illustrates a perspective view of a chassis drawer 301 for receiving modular information handling resources, in accordance with embodiments of the present disclosure. As shown in FIG. 20, chassis drawer 301 may comprise a plurality of information handling resource caddies 302, a drawer cover 308, a drawer sleeve 310, and a caddy tray 316.

Caddy tray 316 may be constructed from steel, aluminum, plastic, and/or any other suitable material. Although caddy tray 316 may have any suitable size and/or shape, caddy tray 316 is depicted in the embodiments of FIG. 20 as having a substantially planar bottom 318 defining a width and depth of caddy tray 316. Caddy tray 316 may also include a face 320 mechanically affixed to bottom 318. Face 320 may be substantially planar and may further be generally perpendicular to bottom 318.

In some embodiments, face 320 may be substantially equal to the width of caddy tray 316 and may define a height of caddy tray 316. In these and other embodiments, face 320 may include handles, pull tabs, and/or other features allowing a person to pull on face 320 in order to translate chassis drawer 301 from a closed position to an open position in a direction generally parallel to the depth of bottom 318. In these and other embodiments, face 320 may include a grill, vent, and/or other opening allowing gaseous fluid to enter and/or exit through face 320.

Caddy tray 316 may be adapted to hold and structurally support one or more caddies 302 and information handling resources 220 disposed in such caddies 302. A caddy 302 may be coupled to caddy tray 316 via a hinge 305. Hinge 305 may be located along an edge of bottom 318 and may have an axis generally parallel to the depth of caddy tray 316. Thus, a caddy 302 may pivot about hinge 305 relative to caddy tray 316. In the embodiments represented by FIG. 20, a caddy tray 316 may have coupled thereto two opposite facing caddies 302, such that when pivoted about their respective hinges 304, caddies 302 rotate about generally parallel axes, but in opposite radial directions.

As also shown in FIG. 20, a caddy 302 may have a bearing 304 configured to engage with a corresponding arcuate opening 306 of face 320. Accordingly, the size of opening 306 may limit the radial motion of a caddy 302 about its corresponding hinge 305. In addition, opening 306 may include a downward projection 307 or other mechanical structure in which bearing 304 may rest in order to allow caddy 302 to remain in an open position while the bays 330 of such caddy 302 are accessed.

Chassis drawer 301 may also include a drawer cover 308 fixedly coupled to caddy tray 316. Drawer cover 308 may also be slidably coupled to drawer sleeve 310 fixedly coupled to a chassis (e.g., chassis 100) such that drawer 308 (and caddy tray 316 fixedly coupled thereto) may slide relative to drawer sleeve 310 in a direction generally parallel to the depth of caddy tray 316 to translate chassis drawer 301 between an open position relative to the chassis and a closed position (e.g., in which face 320 is substantially flush or even with a side of the chassis). In some embodiments, drawer sleeve 310 may include flanges 311 or other structural elements for guiding the motion of drawer cover 308 and/or caddy tray 316 relative to drawer sleeve 310.

Further, chassis drawer 301 may have one or more interface connectors 309 configured to electrically couple to backplane 326 (depicted in greater detail in FIGS. 21-23) thus providing electrical coupling between information handling resources 220 disposed in caddies 302 and other information handling resources of a chassis.

Accordingly, in the embodiments represented by FIG. 20, drawer 301 may allow a user to slide drawer 301 from a chassis and access drives from a top of drawer 301 by appropriately applying force to a caddy 302 (e.g., via bearing 304) to rotate such caddy 302 to expose bays 330 thereof.

Figure 21:
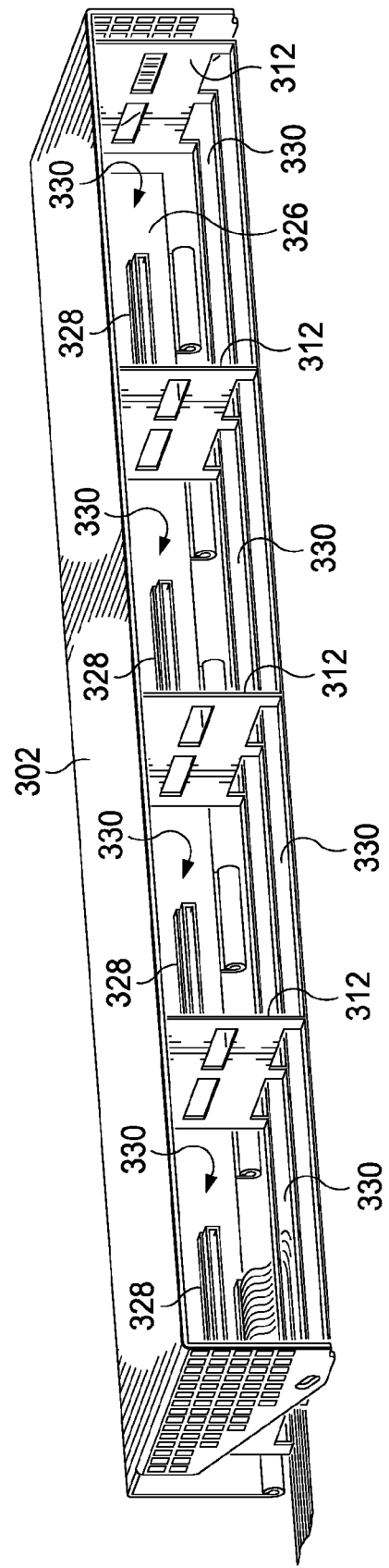
FIG. 21 illustrates a perspective view of an information handling resource caddy for use in the chassis drawer depicted in FIG. 20, in accordance with embodiments of the present disclosure.
Figure 22:
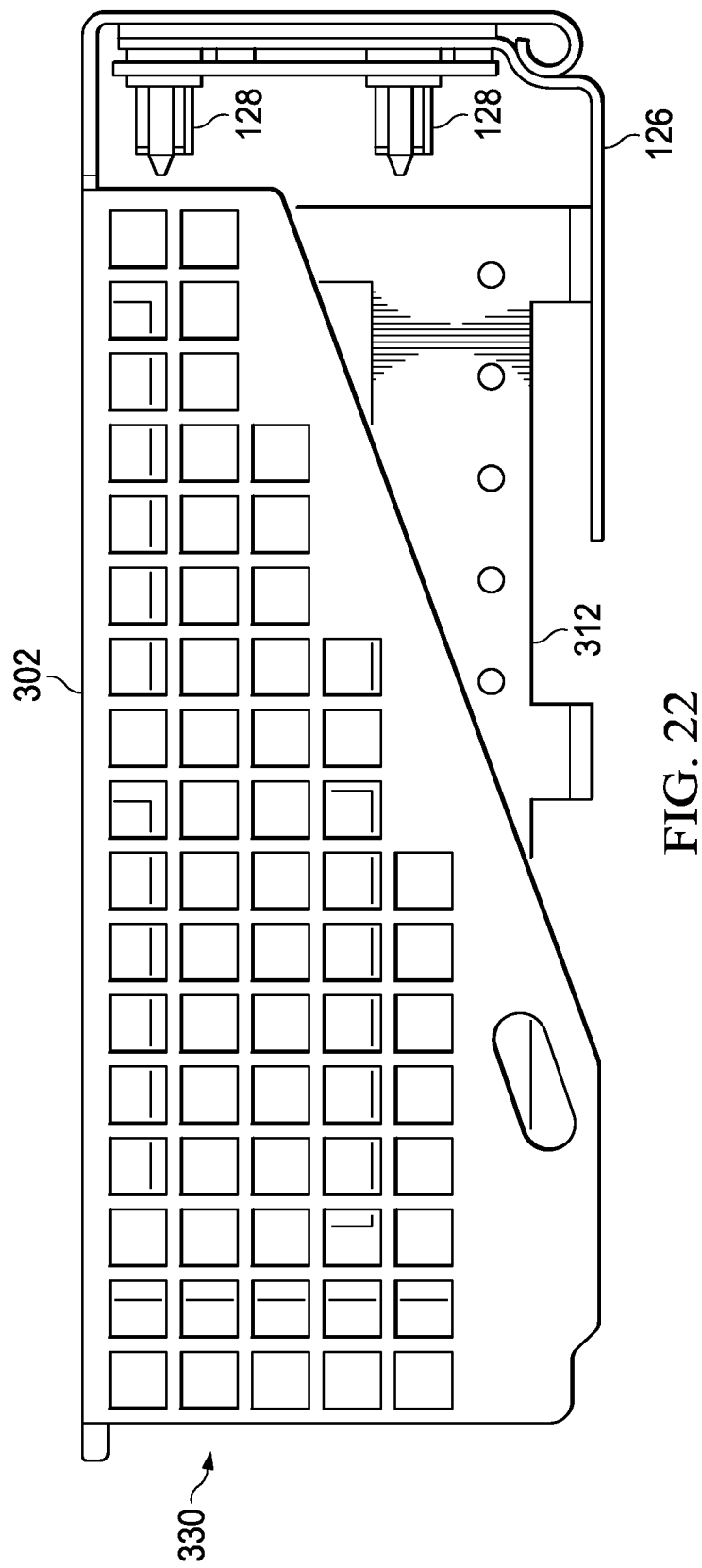
FIG. 22 illustrates a side view of an information handling resource caddy for use in the chassis drawer depicted in FIG. 20, in accordance with embodiments of the present disclosure.

FIGS. 21 and 22 illustrate a perspective view and a side view, respectively, of a caddy 302, in accordance with embodiments of the present disclosure. As shown in FIGS. 21 and 22, a backplane 326 may be mechanically coupled to caddy 302. Backplane 326 may comprise any system, device, or apparatus configured to interconnect modular information handling resources inserted into bays 330 of caddy 302 (e.g., hard disk drives) with each other and/or to other information handling resources of a chassis. Accordingly, backplane 326 may include slots 328 and/or other connectors configured to receive corresponding electrical connectors of information handling resources in order to electrically couple information handling resources inserted into bays 330 to backplane 326. In some embodiments, backplane 326 may have structure and/or functionality identical or similar to that of backplane 126 described above.

In some embodiments, all slots 328 of backplane 326 may be configured to receive identical or similar information handling resources having substantially similar form factors and/or functionality (e.g., 2.5-inch hard disk drives). In other embodiments, some slots 328 may be configured to receive an information handling resource different in form factor and/or functionality than that for which another slot 328 is configured. In these and other embodiments, slots 328 may have structure and/or functionality identical or similar to that of slots 128 described above.

As shown in FIGS. 21 and 22, one or more structural features of caddy 302 may define the plurality of bays 330 for receiving information handling resources 220. For example, caddy 302 may include a plurality of support members 312, such that laterally adjacent bays 330 (e.g., bays 330 adjacent in a direction of the depth of caddy tray 316) are separated by a support member 312. In addition, each support member 312 may have a plurality of structural features (e.g., guide flanges) for mechanically guiding an information handling resource 220 into and out of a bay 330. In some embodiments, vertically adjacent bays 330 (e.g., bays 330 adjacent in a direction of the height of face 320) may be separated by one or more structural features (e.g., guide flanges). In addition, bays 330 may be defined by an associated backplane 326 in addition to one or more structural elements of caddy 302. Accordingly, a bay 330 may include a suitable combination of structural elements configured to mechanically mate with an information handling resource 220 to allow components of the information handling resource 220 to electrically couple to backplane 326 when such information handling resource is received into the bay 330. A bay 330 may also be configured to allow modular information handling resources 220 to be easily inserted and removed from the bay 330 as desired by a user.

Although caddy 302 may be constructed so as to support any suitable arrangement of bays 330, in the embodiments represented by FIGS. 20-22, caddy 302 is configured with eight bays 330, such that two drives may be oriented one over the other in each of four openings.

In some embodiments, all bays 330 of caddy 302 may be configured to receive identical or similar information handling resources 220 having substantially similar form factors and/or functionality (e.g., 2.5-inch hard disk drives). In other embodiments, some bays 330 may be configured to receive an information handling resource 220 different in form factor and/or functionality than that for which another bay 330 is configured.

Figure 23:
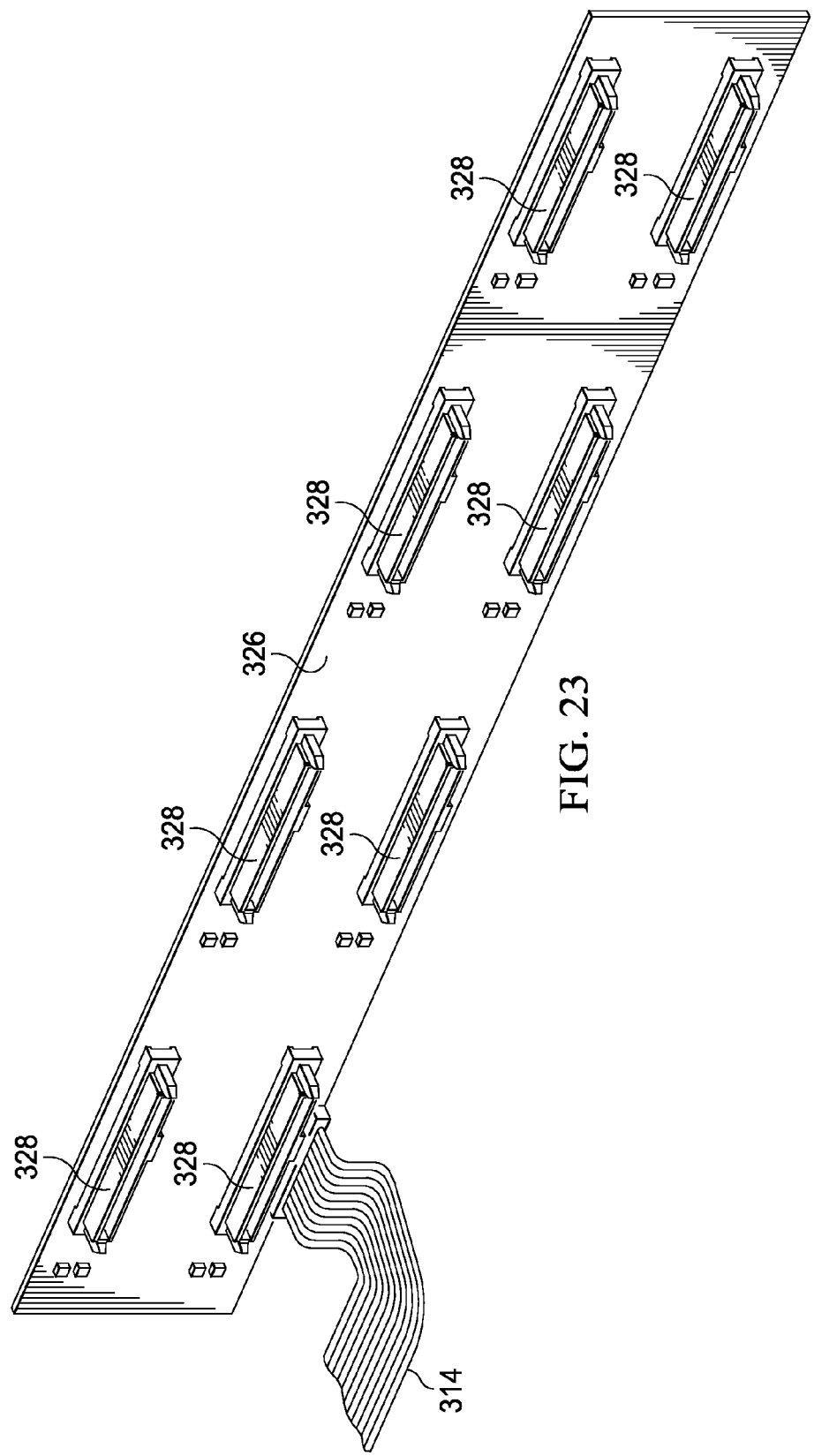
FIG. 23 illustrates a perspective view of a backplane for use in the chassis drawer depicted in FIG. 20, in accordance with embodiments of the present disclosure.

FIG. 23 illustrates a perspective view of a backplane 326, in accordance with embodiments of the present disclosure. As shown in FIG. 23, backplane 326 may include a tail 314 for carrying conductive traces for electrically coupling slots 328 to one or more other information resources of a chassis.

Although the present disclosure has been described in detail, it should be understood that various changes, substitutions, and alterations can be made hereto without departing from the spirit and the scope of the disclosure as defined by the appended claims.

What is claimed is:

1. A backplane for electrically coupling modular information handling resources to one or more other information handling resources, comprising:
    a printed circuit board having a first surface and a second surface opposite the first surface;
    a first plurality of openings formed in the first surface;
    a first plurality of slots mounted to the printed circuit board within the first plurality of openings;
    a second plurality of openings formed in the second surface; and
    a second plurality of slots mounted to the printed circuit board within the second plurality of openings.

2. The backplane of claim 1, wherein each of the second plurality of slots are offset from an adjacent slot of the first plurality of slots in a direction parallel to a plane defined by the first surface.

3. The backplane of claim 1, wherein each of the second plurality of slots are rotated approximately 180 degrees from an adjacent slot of the first plurality of slots.

4. The backplane of claim 1, wherein each of the first plurality of openings comprise recessed areas formed below the first surface.

5. The backplane of claim 4, wherein each of the second plurality of openings comprise recessed areas formed below the second surface.

6. The backplane of claim 5, the second plurality of openings formed by omitting one or more layers of the printed circuit board during construction of the printed circuit board at a location corresponding to the second plurality of openings.

7. The backplane of claim 5, the second plurality of openings formed by removing one or more layers of the printed circuit board during construction of the printed circuit board at a location corresponding to the second plurality of openings.

8. The backplane of claim 4, the first plurality of openings formed by omitting one or more layers of the printed circuit board during construction of the printed circuit board at a location corresponding to the first plurality of openings.

9. The backplane of claim 4, the first plurality of openings formed by removing one or more layers of the printed circuit board during construction of the printed circuit board at a location corresponding to the first plurality of openings.

10. A method, comprising:
    providing a printed circuit board having a first surface and a second surface opposite the first surface;
    forming a first plurality of openings in the first surface;
    mounting a first plurality of slots to the printed circuit board within the first plurality of openings;
    forming a second plurality of openings in the second surface; and mounting a second plurality of slots to the printed circuit board within the second plurality of openings.

11. The method of claim 10, wherein each of the second plurality of slots are offset from an adjacent slot of the first plurality of slots in a direction parallel to a plane defined by the first surface.

12. The method of claim 10, wherein each of the second plurality of slots are rotated approximately 180 degrees from an adjacent slot of the first plurality of slots.

13. The method of claim 10, wherein each of the first plurality of openings comprise recessed areas formed below the first surface.

14. The method of claim 13, wherein each of the second plurality of openings comprise recessed areas formed below the second surface.

15. The method of claim 14, wherein forming the second plurality of openings comprises omitting one or more layers of the printed circuit board during construction of the printed circuit board at a location corresponding to the second plurality of openings.

16. The method of claim 14, wherein forming the second plurality of openings comprises removing one or more layers of the printed circuit board during construction of the printed circuit board at a location corresponding to the second plurality of openings.

17. The method of claim 13, wherein forming the first plurality of openings comprises omitting one or more layers of the printed circuit board during construction of the printed circuit board at a location corresponding to the first plurality of openings.

18. The method of claim 13, wherein forming the first plurality of openings comprises removing one or more layers of the printed circuit board during construction of the printed circuit board at a location corresponding to the first plurality of openings.

* * * * *